(12) United States Patent
Hegde

(10) Patent No.: US 7,296,619 B2
(45) Date of Patent: Nov. 20, 2007

(54) TWIN FIN ARRAYED COOLING DEVICE WITH HEAT SPREADER

(75) Inventor: Shankar Hegde, Annassandrapalya Bangalore (IN)

(73) Assignee: Hewlett-Packard Development Company, L.P., Houston, TX (US)

( * ) Notice: Subject to any disclaimer, the term of this patent is extended or adjusted under 35 U.S.C. 154(b) by 638 days.

(21) Appl. No.: 10/971,827

(22) Filed: Oct. 21, 2004

(65) Prior Publication Data

US 2006/0096741 A1    May 11, 2006

(51) Int. Cl.
F28D 15/02 (2006.01)
F28F 7/00 (2006.01)

(52) U.S. Cl. .................... 165/104.33; 165/80.3

(58) Field of Classification Search ........... 165/104.21, 165/104.26, 104.33, 80.2, 80.3
See application file for complete search history.

(56) References Cited

U.S. PATENT DOCUMENTS

| | | | |
|---|---|---|---|
| 5,288,203 A | 2/1994 | Thomas | |
| 5,375,655 A | 12/1994 | Lee et al. | |
| 5,964,285 A | 10/1999 | Huang et al. | |
| 6,026,895 A * | 2/2000 | Moresco et al. | ............ 165/185 |
| 6,109,340 A | 8/2000 | Nakase et al. | |
| 6,118,658 A | 9/2000 | Nakase | |
| 6,134,108 A | 10/2000 | Patel et al. | |
| 6,152,214 A | 11/2000 | Wagner | |
| 6,176,299 B1 | 1/2001 | Hanzlik et al. | |
| 6,206,087 B1 | 3/2001 | Nakase et al. | |
| 6,259,601 B1 | 7/2001 | Jaggers et al. | |
| D464,938 S | 10/2002 | Hegde | |
| 6,505,680 B1 | 1/2003 | Hegde | |
| 6,508,300 B1 | 1/2003 | Hegde | |
| D471,523 S | 3/2003 | Hegde | |
| D471,881 S | 3/2003 | Hegde | |
| 6,543,522 B1 | 4/2003 | Hegde | |
| 6,631,756 B1 | 10/2003 | Hegde | |
| 6,705,795 B2 | 3/2004 | Hegde | |
| 6,779,593 B1 | 8/2004 | Hegde | |
| 6,789,610 B1 | 9/2004 | Hegde | |
| 7,028,757 B1 * | 4/2006 | Hegde | ................... 165/104.21 |
| 2002/0179290 A1 * | 12/2002 | Larson | ................... 165/104.33 |
| 2003/0034150 A1 * | 2/2003 | Kozyra | ................... 165/104.33 |
| 2005/0211416 A1 * | 9/2005 | Kawabata et al. | .......... 165/80.3 |

FOREIGN PATENT DOCUMENTS

EP    1 081 760    3/2004

* cited by examiner

Primary Examiner—Teresa J. Walberg

(57) ABSTRACT

A cooling device including a split-core with a plurality of twin fins connected with a plurality of grooves on the split-core is disclosed. Each twin fin includes a root and a pair of vanes extending from the root. Each root is connected with one of the grooves to mount the twin fins to the split-core. A heat spreader is in contact with a top portion of the vanes and a heat pipe is connected with the heat spreader and the split-core. A heat concentration in the split-core is dissipated by a thermal path through the heat pipes to the heat spreader and into the vanes and also by a path upward into the split-core and into the vanes via the roots of the twin fins.

27 Claims, 25 Drawing Sheets

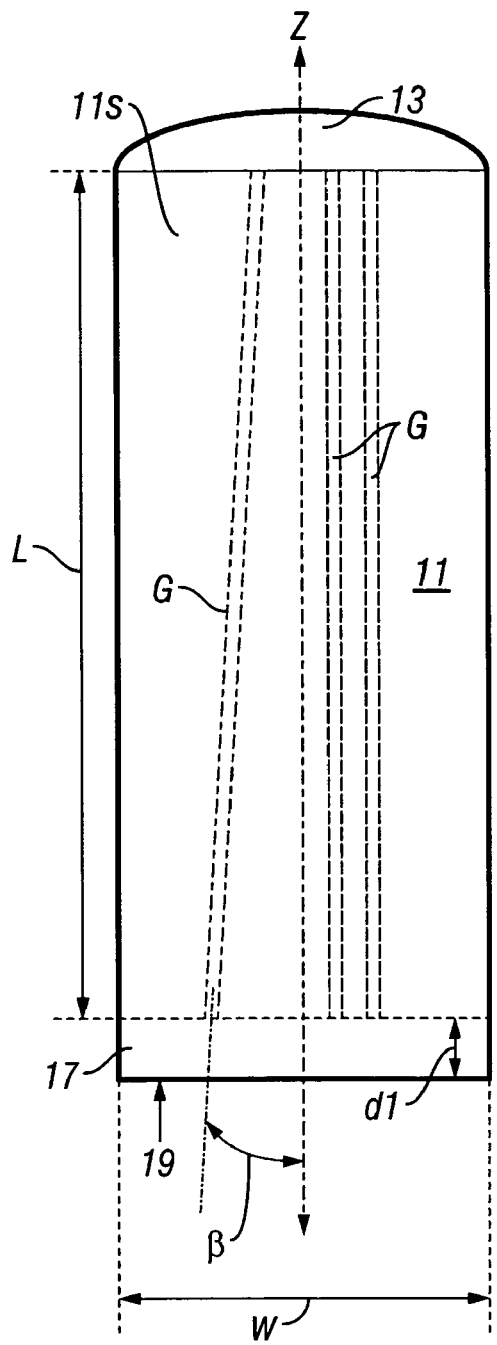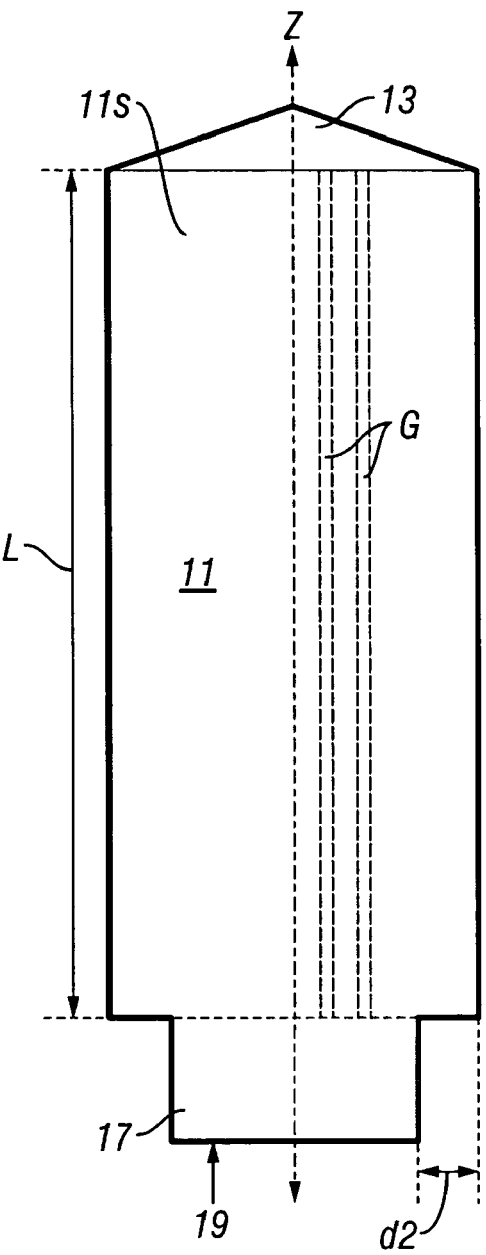
FIG. 7a
FIG. 7b

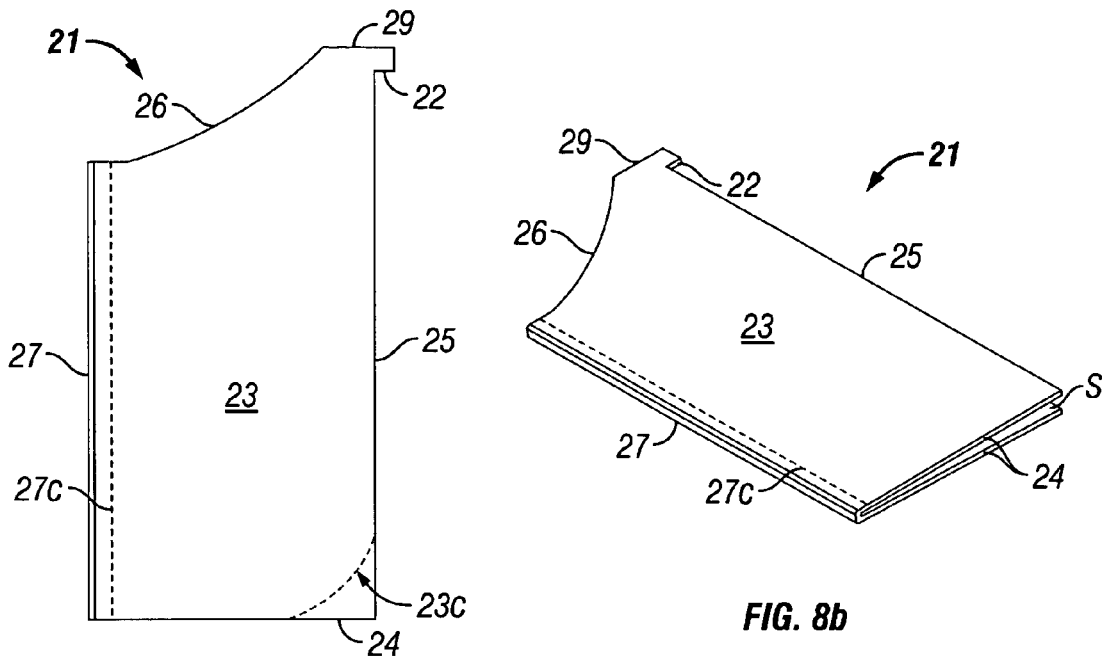
FIG. 8a
FIG. 8b
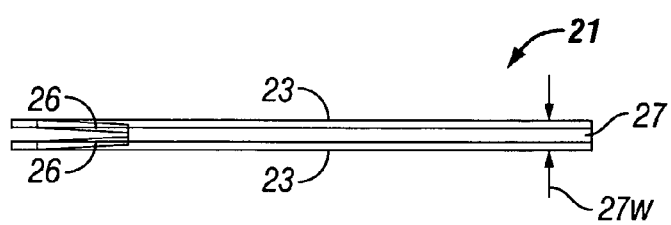
FIG. 8c
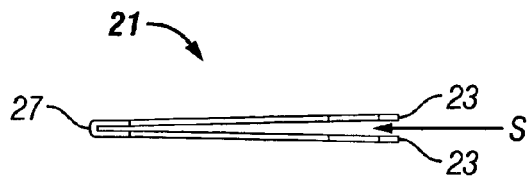
FIG. 8d
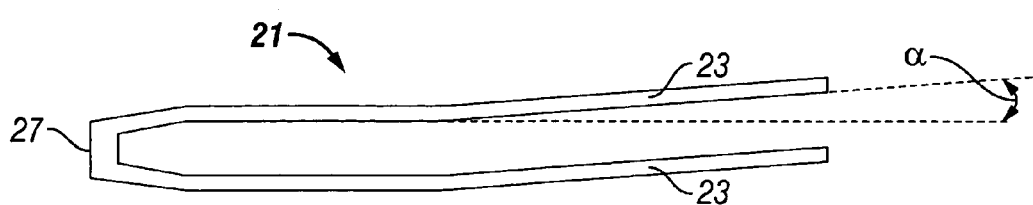
FIG. 8e

TWIN FIN ARRAYED COOLING DEVICE WITH HEAT SPREADER

FIELD OF THE INVENTION

The present invention relates generally to a cooling device for dissipating heat from a component in thermal communication with the cooling device. More specifically, the present invention relates to a cooling device including a split-core and an array of twin fins connected with a split-core and a heat spreader connected with a top portion of vanes of the twin fins and a heat pipe connected with the split-core and the heat spreader. The heat pipe thermally transfers a portion of the heat concentrated in the split-core to the heat spreader where the heat is transferred to the top portion of the vanes.

BACKGROUND OF THE INVENTION

It is well known in the electronics art to place a heat sink in contact with an electronic device so that waste heat generated by operation of the electronic device is thermally transferred to the heat sink to cool the electronic device. However, with continued increases in areal densities and system clock speeds in electronic devices such as microprocessors (CPU's), digital signal processors (DSP's), and application specific integrated circuits (ASIC), the amount of waste heat generated by those electronic devices and the operating temperature of those electronic devices are directly proportional to clock speed and device geometries. Efficient operation of a CPU as well as other high power dissipation electronic devices requires that waste heat be continuously and effectively removed.

However, as the aforementioned areal densities and system clock speeds of electronic devices continue to increase, a heat flux of the electronic devices also increases. Although air cooled heat sinks are commonly used to dissipate waste heat from the aforementioned electronic devices, the increased heat flux in high performance electronic devices is often concentrated in a small area, usually on a package surface that will be placed in thermal contact with the heat sink. The ability to effectively dissipate ever increasing levels of heat flux in high performance electronic devices has challenged current heat sink designs where the entire heat sink is fabricated using processes such as machining, forging, casting, and extrusion. Those processes make it difficult to increase the number of fins or an area of the fins in order to effectively dissipate heat flux concentration.

Typically, a heat mass includes a mounting surface that is in thermal communication with the electronic device and is operative to thermally conduct the waste heat away from the device and into the heat mass. As a result, the heat flux from the electronic device is concentrated in the area of the heat mass near the mounting surface. Ideally, it is desirable to spread the heat flux in the heat mass over as much of a volume of the heat mass as possible so that the heat is efficiently transferred to the fins and dissipated by the air flow over the fins.

Heat flux is a thermal output per unit of area (i.e. $W/cm^2$). For example, if a total thermal output is 100 Watts over a heat source having dimensions of 3.5 cm*3.5 cm, then the heat flux is 100 W÷(3.5 cm*3.5 cm)=8.163 $W/cm^2$. At present, based on area and cost constraints, electronic device package size remains the same or decreases while the areal densities and clock speeds continue to increase. Consequently, the problems associated with heat flux concentration continue to increase and those problems cannot be solved solely by increasing heat sink size, the number of fins, or fan capacity.

Consequently, there is a need for a cooling device with improved thermal conductivity that reduces heat flux concentration and efficiently dissipates waste heat from a component in thermal communication with the cooling device.

SUMMARY OF THE INVENTION

The cooling device of the present invention solves the aforementioned heat flux concentration problems. The cooling device includes a plurality of twin fins with each twin fin including a root and a pair of vanes extending outward of the root. The vanes are spaced apart to define a slot between the vanes and each vane includes a top portion, a leading edge, a trailing edge, and an outer edge. A split-core includes a plurality of grooves that are adapted to receive the roots of the vanes, a top face, a base, a mounting surface adapted to thermally connect the split-core with a component to be cooled, a heat spreader connected with the top portion of the vanes, and a heat pipe connected with the heat spreader and the split-core.

The aforementioned problems associated with heat flux concentration are addressed by the split-core because heat thermally conducted into the split-core via the mounting surface is dissipated over multiple thermal paths. In a first path, a portion of a heat flux concentration proximate the mounting surface is thermally transferred by the heat pipe to the heat spreader where the heat is transferred to the top portion of the vanes and is dissipated by an air flow over the vanes. In a second path, the split-core conducts heat away from the component and upward towards the top face of the split-core where the heat spreads outward to the roots of the twin fins. The vanes of the twin fins provide a large surface area for the heat in the split-core to be dissipated by the air flow over vanes.

Another advantage of the split-core is that a length of the split-core need not span an entire length of the root of the vanes. As a result, a length and/or a diameter of the split-core can be reduced with a concomitant reduction in weight and cost of the cooling device.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIGS. 7a and 7b are side views depicting grooves in a split-core.

FIGS. 8a through 8e are profile views depicting a twin fin.

DETAILED DESCRIPTION

Figure 1A:
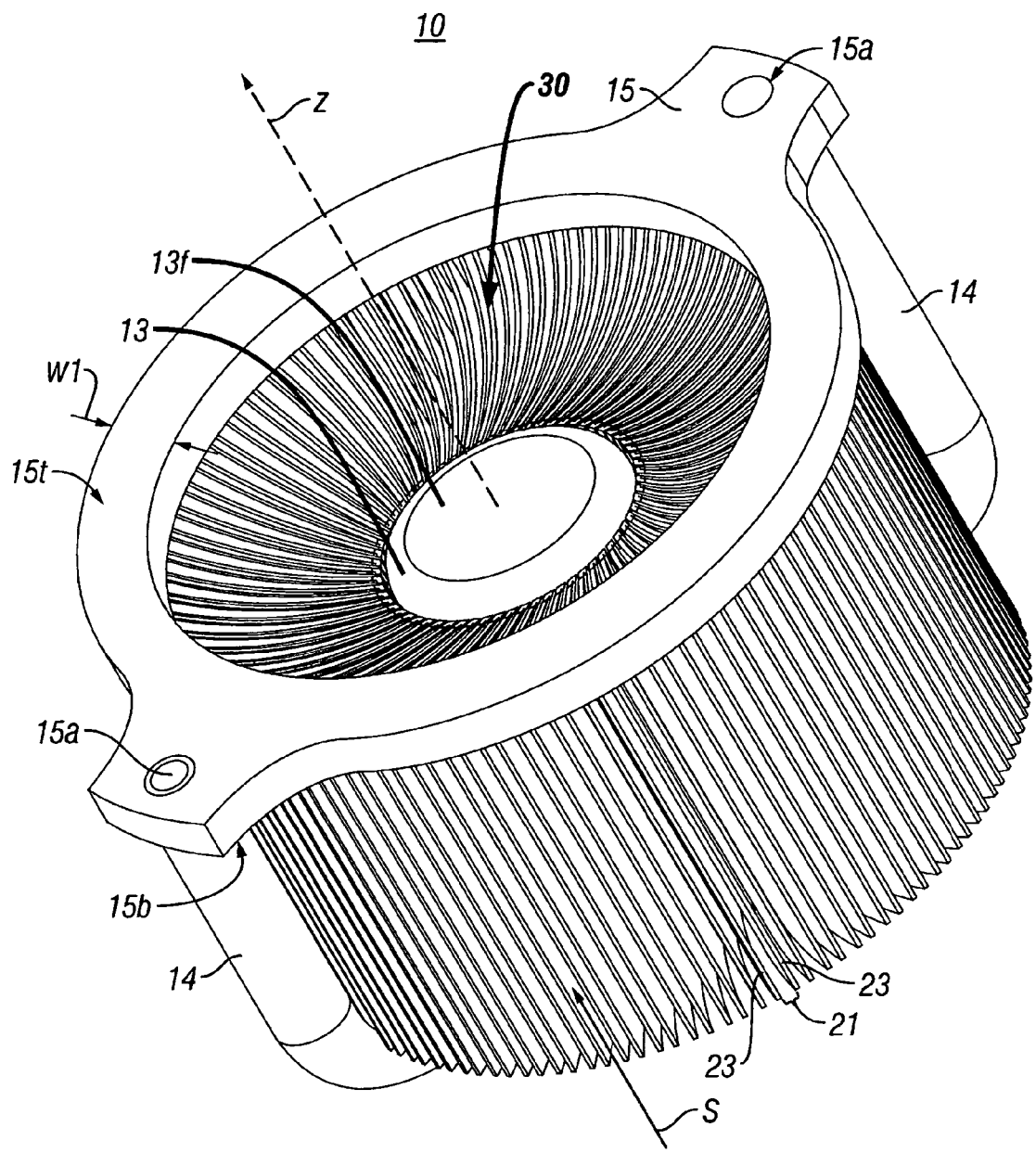
FIGS. 1a and 1b are top and bottom profile views respectively and depict a cooling device.

In the following detailed description and in the several figures of the drawings, like elements are identified with like reference numerals.

As shown in the drawings for purpose of illustration, the present invention is embodied in a cooling device for dissipating heat from a component. The cooling device includes a plurality of twin fins with each twin fin including a root and a pair of vanes extending outward of the root. The vanes of the twin fins are spaced apart to define a slot between the vanes and each vane includes a top portion, a leading edge, a trailing edge, and an outer edge. The cooling device also includes a split-core including a plurality of grooves that are adapted to receive the root of the twin fins, a top face, a base, a mounting surface adapted to thermally connect the split-core with the component, a heat spreader connected with the top portion of the vanes, and a heat pipe connected with the split-core and the heat spreader. The heat pipe is operative to thermally transfer a portion of the heat in the split-core to the heat spreader where the heat is transferred to the vanes.

Waste heat from the component is thermally conducted into the split-core via the mounting surface and is dissipated through multiple thermal paths. In a first path, a first portion of a heat flux concentrated in the split-core proximate the mounting surface is thermally transferred by the heat pipe to the heat spreader where the heat is transferred to the top portion of the vanes and is dissipated by an air flow over the vanes. In a second path, the split-core conducts a second portion of the heat flux away from the component and upward towards the top face of the split-core where the heat spreads outward to the roots of the twin fins and is dissipated by the air flow over the vanes, the top face, the split-core, and through the slots. The cooling device can be used to dissipate waste heat from any component that requires cooling and the component to be cooled is not limited to electronic devices.

In FIGS. 1a through 1e, a cooling device 10 for dissipating heat from a component (not shown) includes a plurality of twin fins 21 with each twin fin 21 including a root 27 and a pair of vanes 23 extending outward of the root 27 and spaced apart to define a slot S between the vanes 23. Each vane 23 includes a top portion 29, a leading edge 26, a trailing edge 24, and an outer edge 25. The cooling device 10 also includes a split-core 11 including a plurality of grooves G that are adapted to receive the roots 27 of the twin fins 21, a top face 13, a base 17, a mounting surface 19 adapted to thermally connect the split-core 11 with the component, a heat spreader 15 connected with the top portions 29 of the vanes 23, and at least one heat pipe 14 connected with the split-core 11 and the heat spreader 15.

Figure 1B:
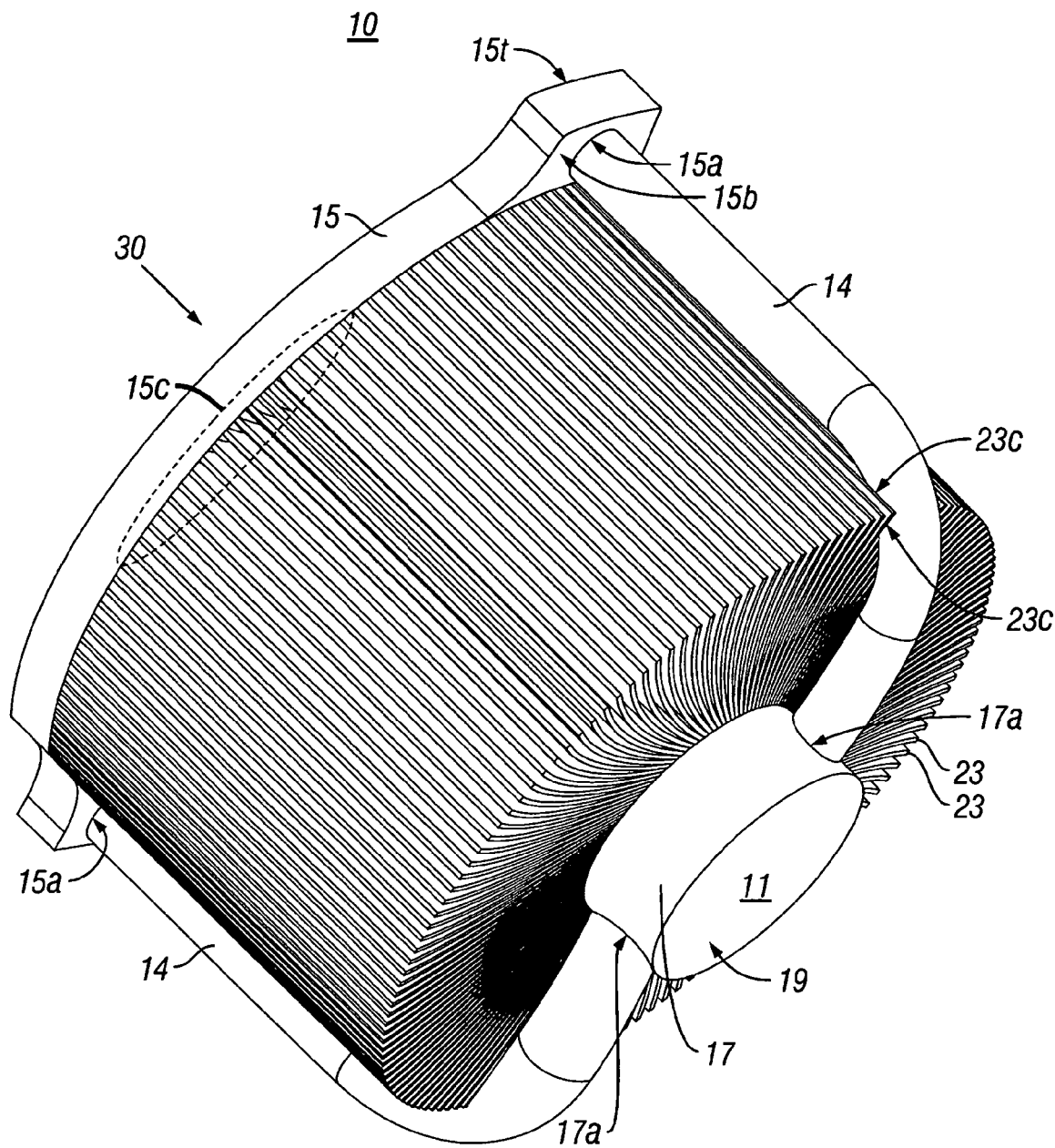
Figure 1C:
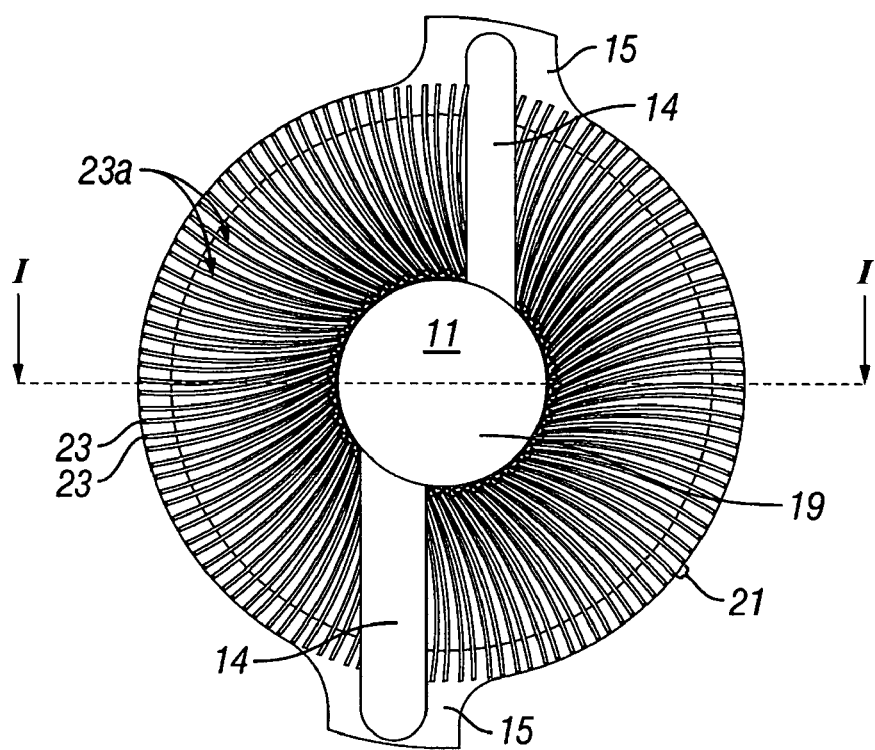
FIGS. 1c and 1d are bottom and side views respectively and depict a cooling device.
Figure 1D:
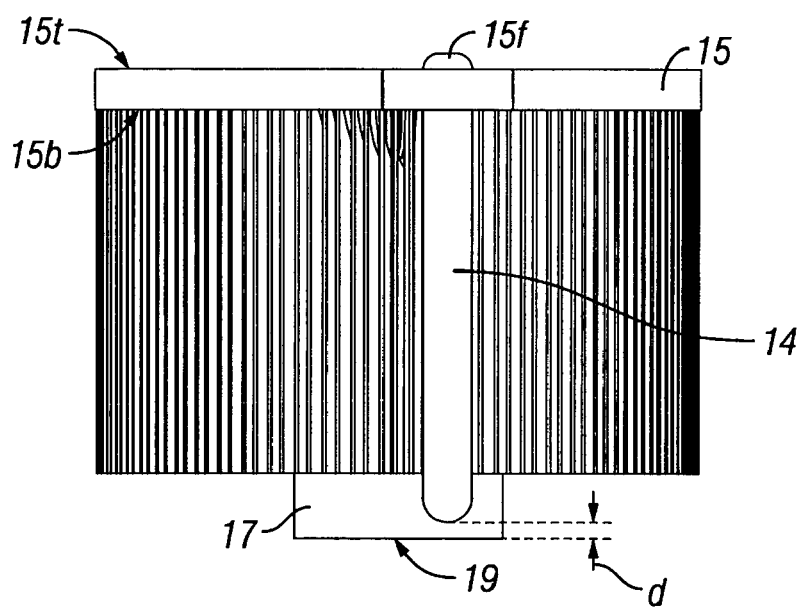
Figure 1E:
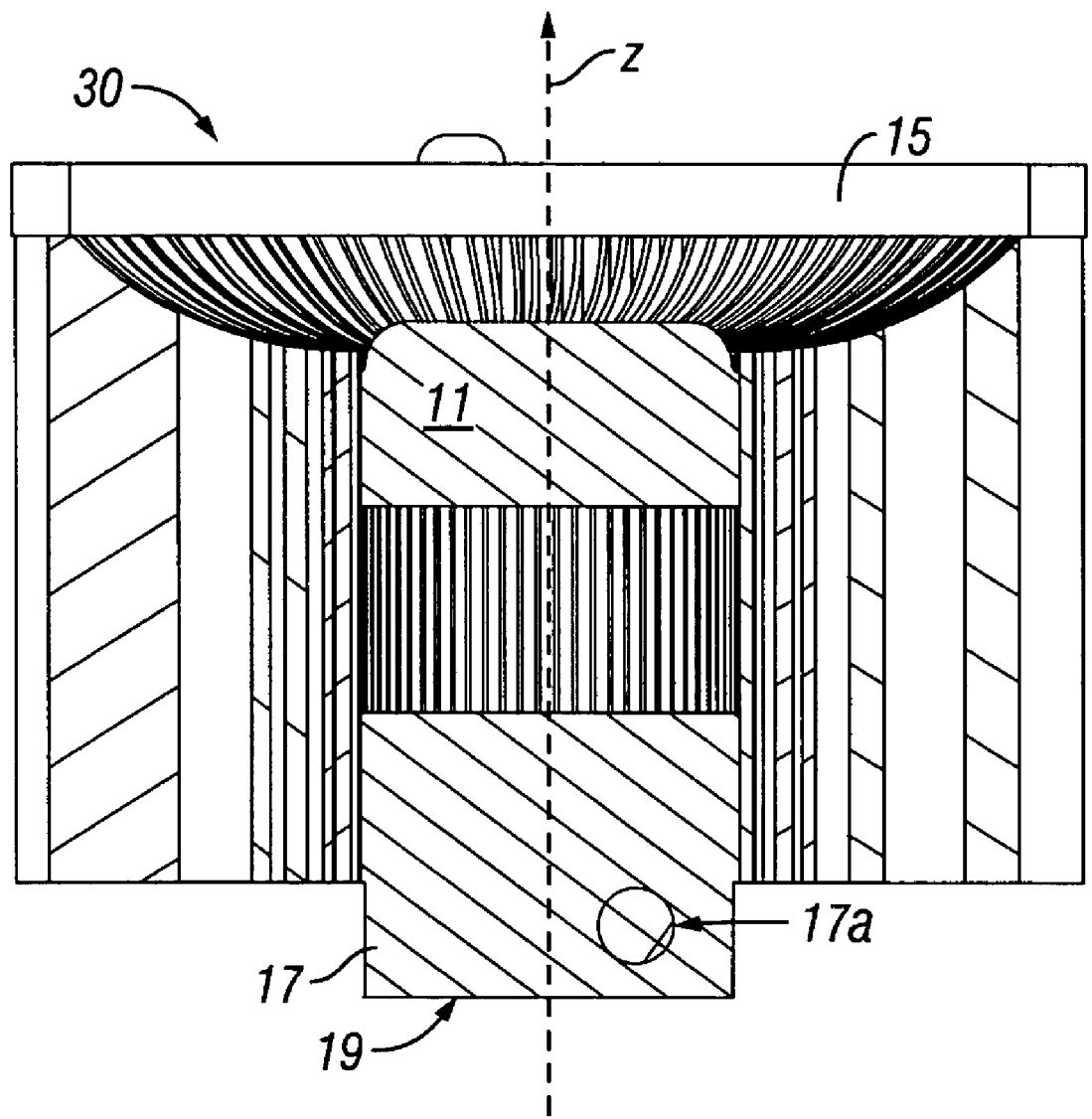
FIG. 1e is a cross-sectional view of a cooling device along a line I-I of FIG. 1c.
Figure 5A:
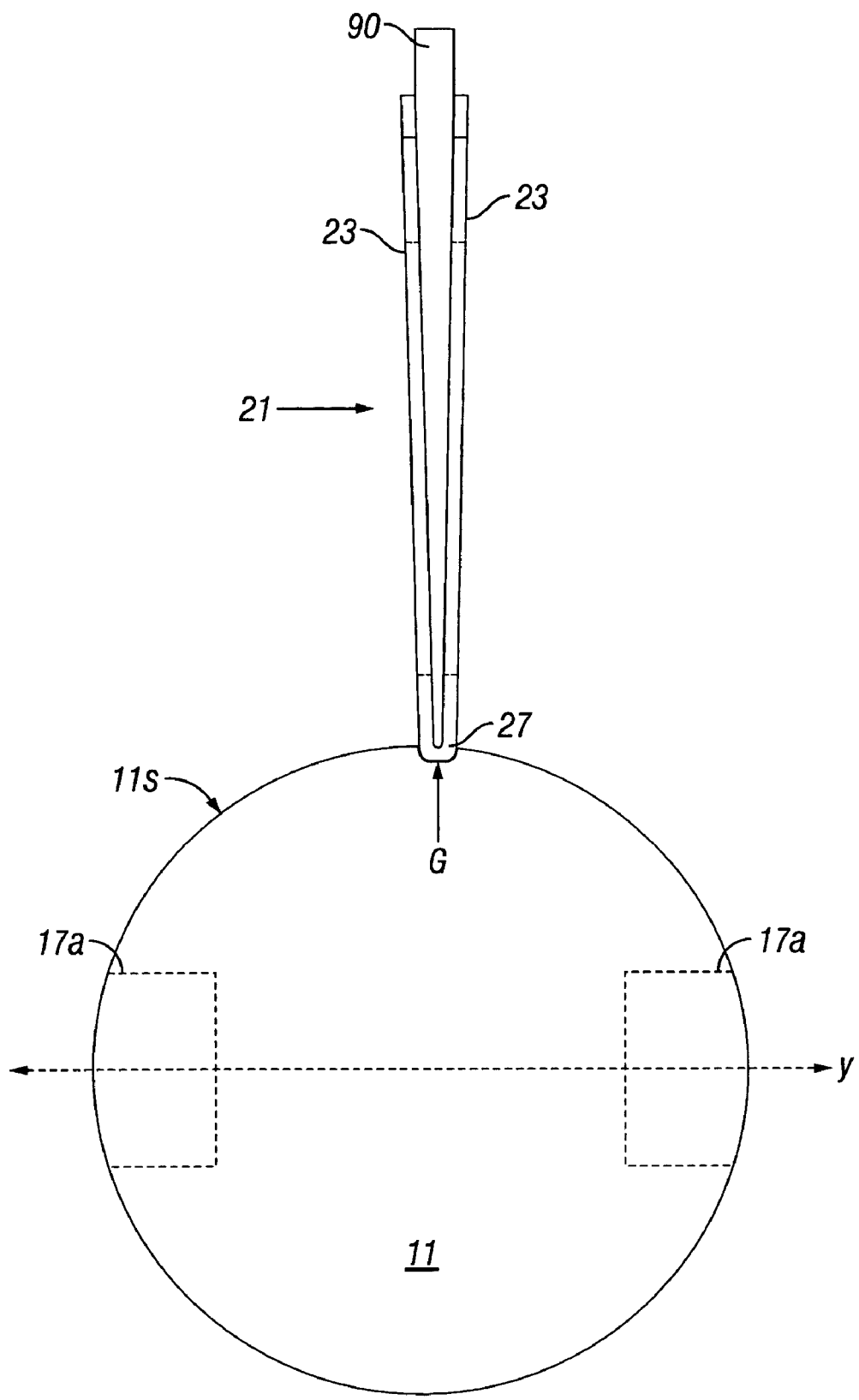
FIGS. 5a and 5b are cross-sectional views depicting an insertion of a twin fin into a groove of a split-core.
Figure 5B:
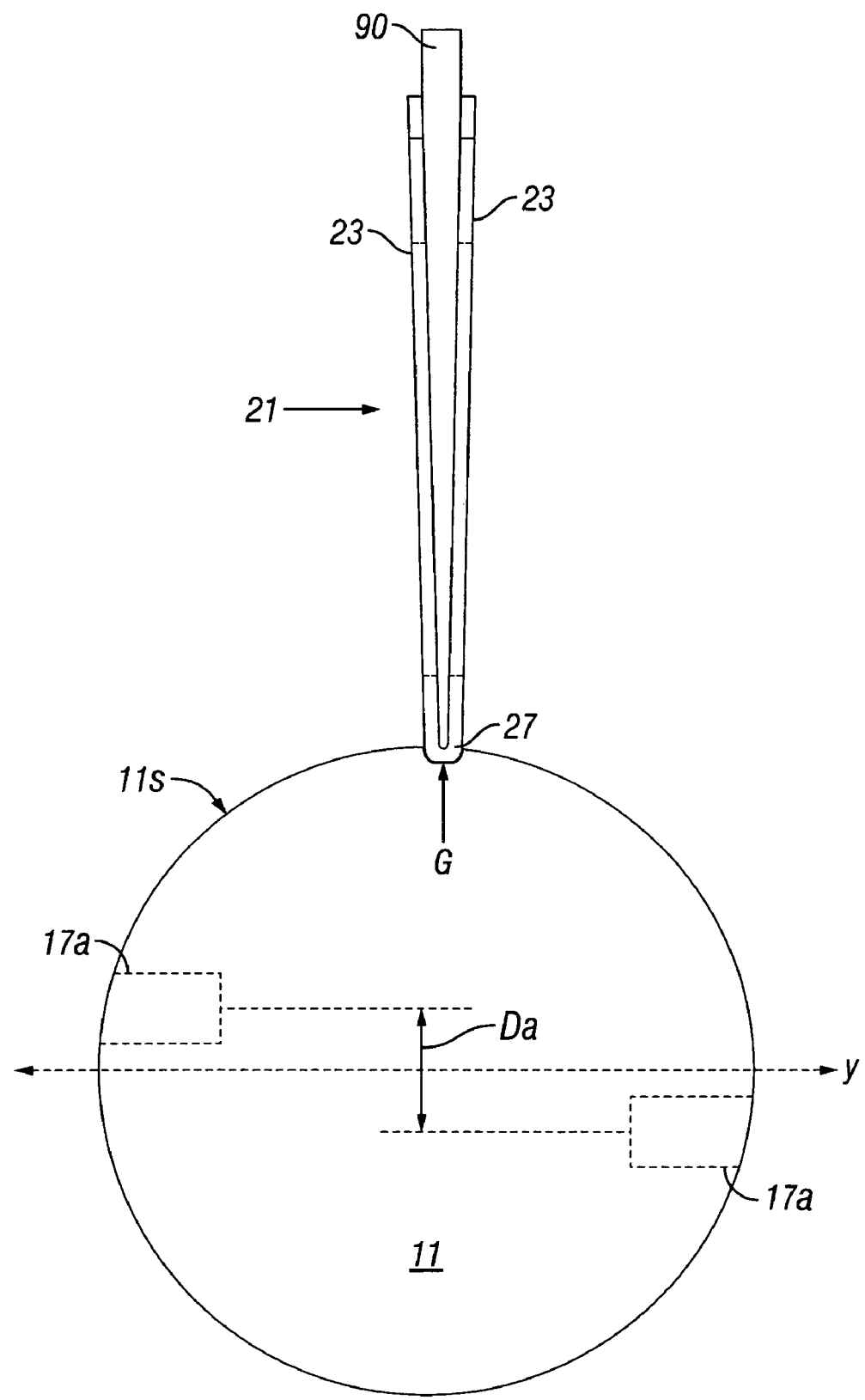

In FIGS. 1a, 1b, and 1e the heat pipe 14 can be connected with the heat spreader 15 and the split-core 11 by a variety of methods that include but are not limited to forming an aperture 15a in the heat spreader 15 and an aperture 17a the split-core 11 and then inserting the heat pipe 14 into the apertures (15a, 17a). Because heat concentration in the spilt-core 11 will be in a volume of the split-core 11 proximate the mounting surface 19 where waste heat from the component enters the split-core 11, it is desirable to position the connection of the heat pipe 14 with the split-core 11 at the base 17 of the split-core 11. Accordingly, the aperture 17a can be positioned in the base 17 as depicted in FIG. 1e. Preferably, the aperture 17a is not a through hole but rather an opening extending only partially into the split-core 11 as depicted in FIGS. 5a and 5b. The apertures 17a can be symmetrically disposed in the split-core 11 as depicted by a line of symmetry Y in FIG. 5a or they can be asymmetrically disposed as depicted in FIG. 5b by an offset distance Da relative to the line of symmetry Y.

On the other hand, the aperture 15a can be a through hole extending between a top and bottom surfaces (15t, 15b) of the heat spreader 15 or a partial opening formed in the bottom surface 15b of the heat spreader 15. If a through hole is used, then the heat pipe 14 can include a threaded portion to receive a fastener 15f (see FIG. 1d) that connects the heat pipe 14 with the heat spreader 15. For example, a machine screw can be used for the fastener 15f. Those skilled in the art will appreciate that other mean can be used to connect the heat pipe 14 with heat spreader 15 including but not limited to welding, brazing, soldering, and press fitting, just to name a few. As another example, the heat pipe 14 can be inserted into the apertures 17a and then brazed to the base 17, followed by inserting the heat pipe 14 into the apertures 15a and brazing the heat pipe 14 to the bottom surface 15b. If the aperture 15a is a through hole, then the heat pipe 14 can be brazed to both the top and bottom surfaces (15t, 15b). Preferably, the process used to connect the heat pipe 14 with the heat spreader 15 and the split-core 11 as well as the dimensions of the apertures (15a, 17a) and the heat pipe 14 are selected to provide a low thermal resistance connection the ensures maximum thermal transfer from the split-core 11 to the heat spreader 15.

In FIG. 1d, for some applications, it may be desirable to design the connection of the heat pipe 14 with the split-core 11 to include an offset distance d between a bottom of the heat pipe 14 and the mounting surface 19 so that a base plate as will be described below or some other means for mounting the cooling device 10 with the component can be effectuated without creating a mechanical interference with the heat pipe 14.

Referring to FIG. 1b, the heat spreader 15 can be connected (see dashed oval 15c) with the top portions 29 of the vanes 23 by a variety of means including but not limited to soldering, brazing, welding, a thermally conductive glue, a thermally conductive resin, and a thermal interface material. Examples of suitable thermal interface materials include but are not limited to thermally conductive pastes, paints, films, and coatings. Preferably, the connection of the heat spreader 15 with the top portions 29 of the vanes 23 generates sufficient force between the heat spreader 15 and the top portions 29 so that a low thermal resistance path is created from the heat spreader 15 to the vanes 23.

Figure 2A:
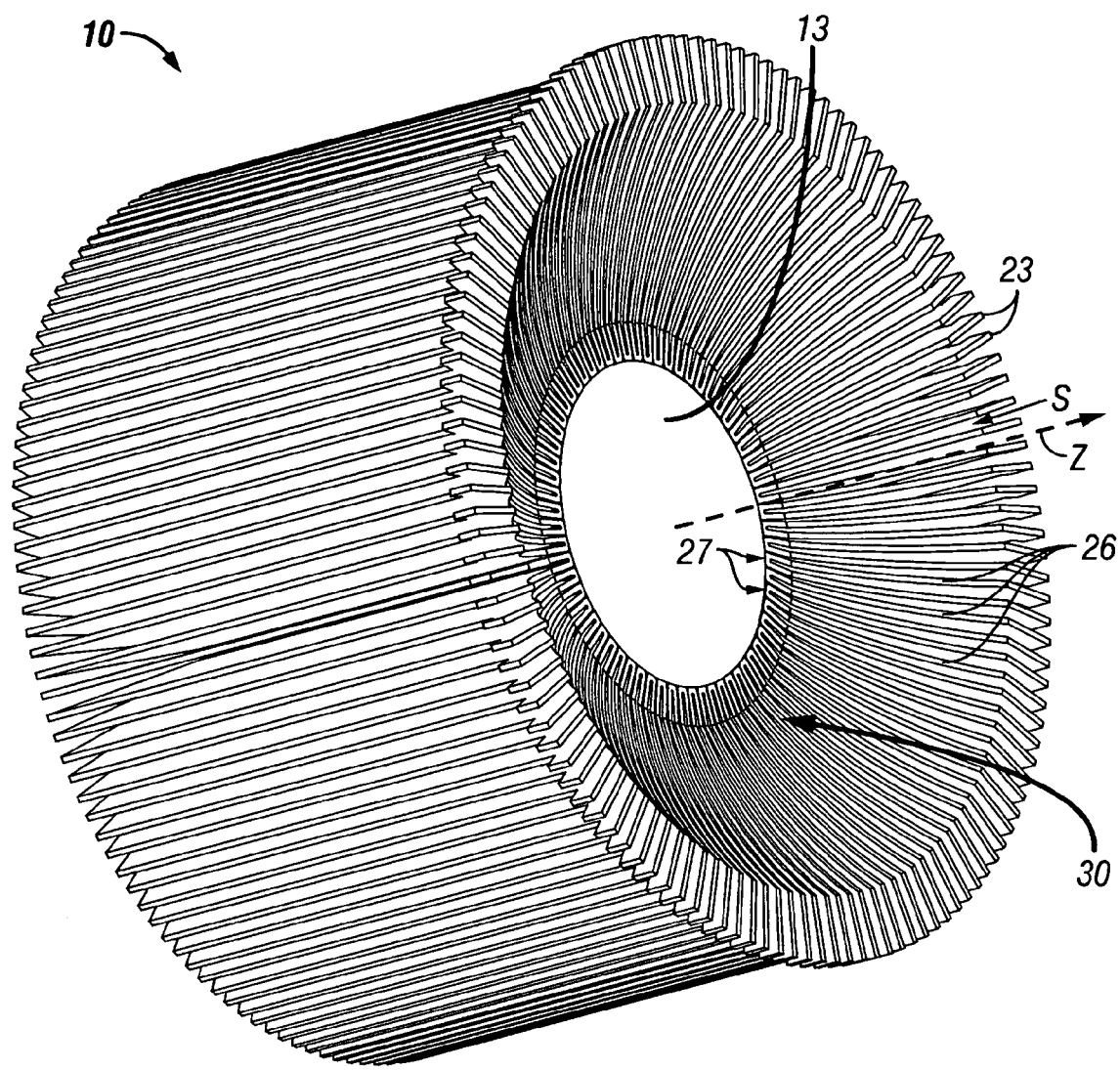
FIGS. 2a and 2b are profile views depicting a plurality of twin fins connected with a split-core.
Figure 2B:
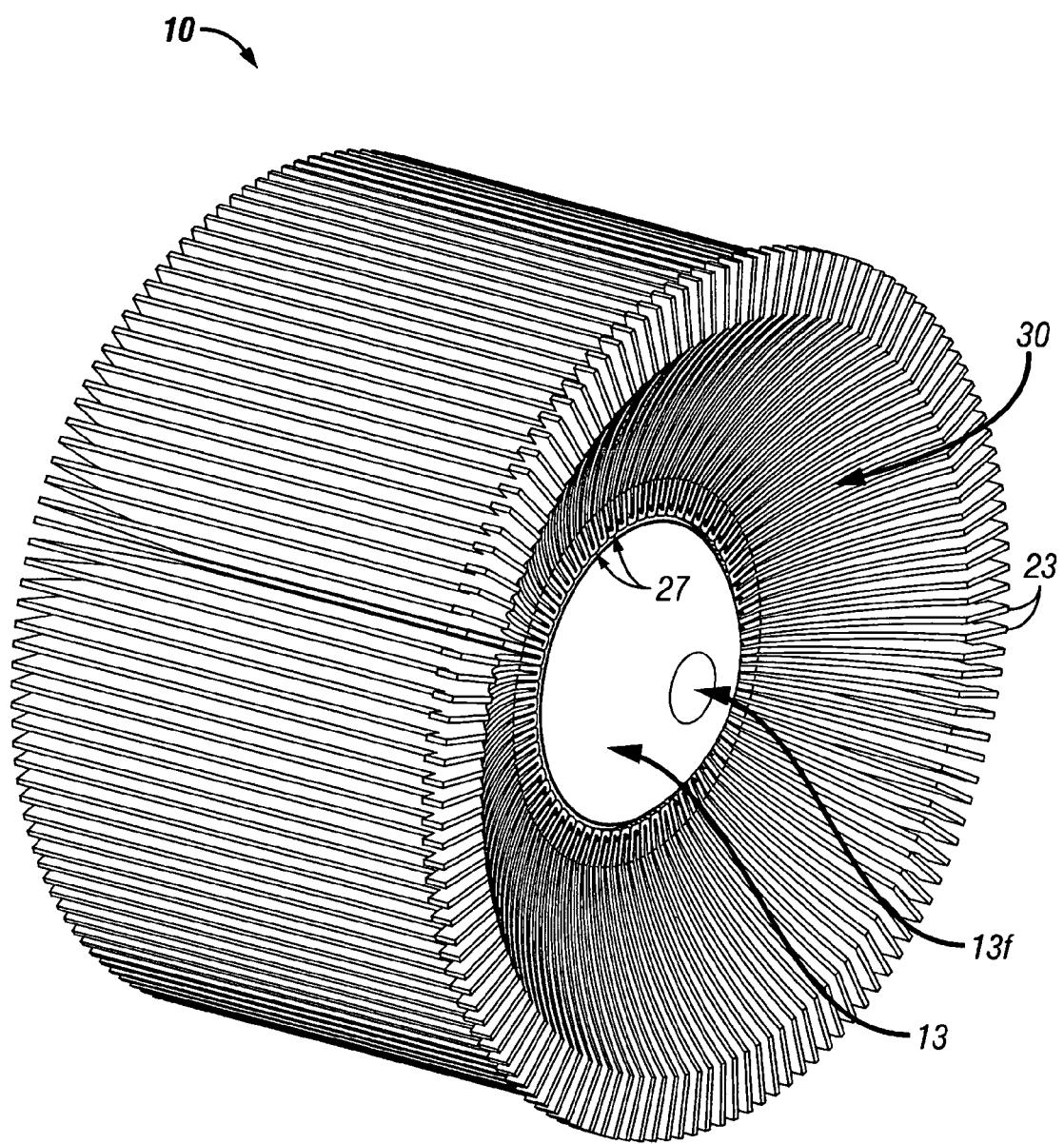
Figure 2C:
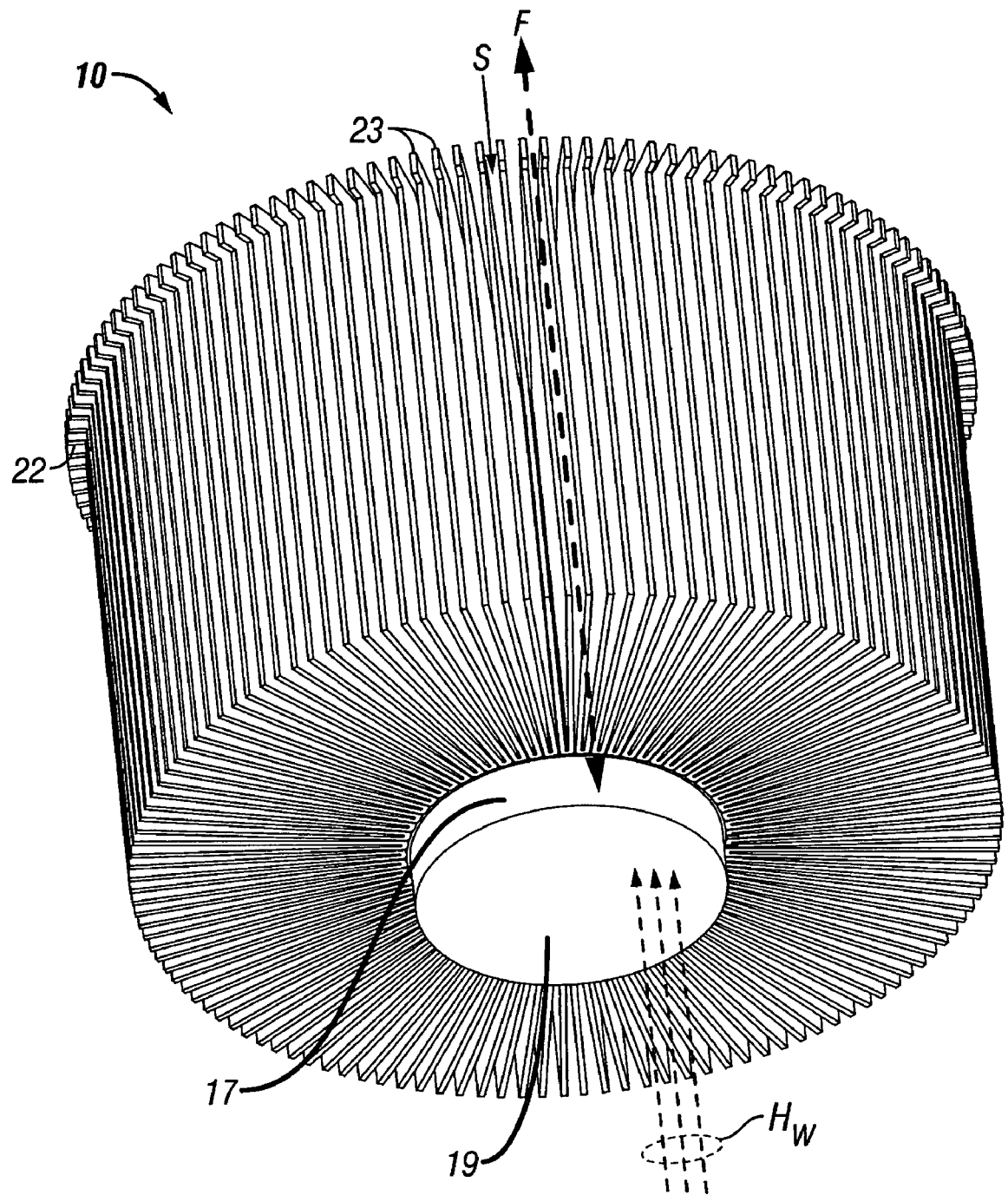
FIG. 2c is a bottom profile view depicting a plurality of twin fins connected with a split-core.
Figure 3:
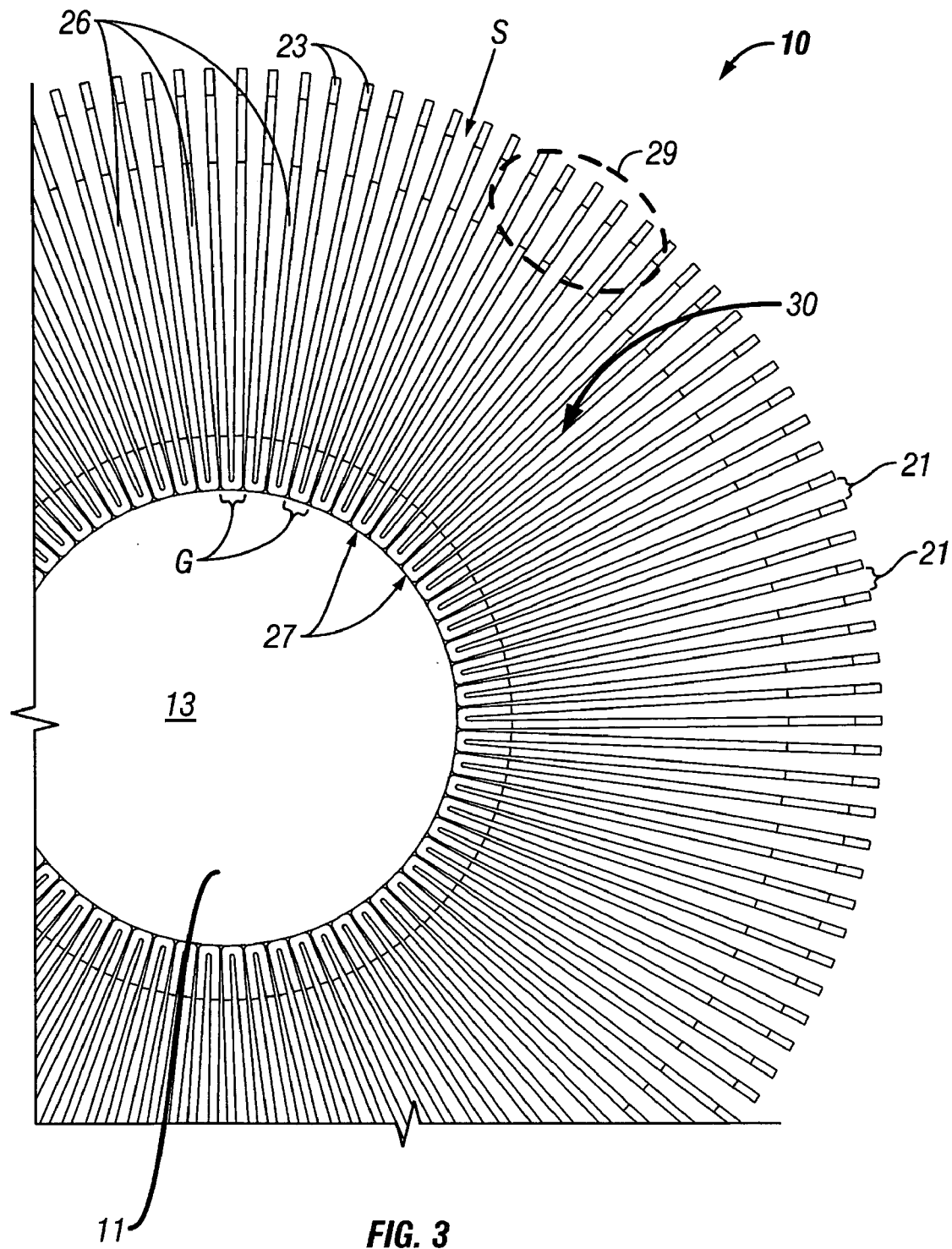
FIG. 3 is an enlarged view depicting a plurality of twin fins connected with a plurality of grooves on a split-core.

A plurality of twin fins 21 connected with the split-core 11 sans the heat spreader 15 and heat pipes 14 are depicted in greater detail in FIGS. 2a, 2b, 2c, and 3. Turning to FIG. 3, a close up view of the device 10 depicts a plurality of the twin fins 21 with their respective roots 27 connected with the grooves G on the split-core 11 such that the twin fins 21 form an array of fins that surround the split-core 11. The leading edges 26 of the vanes 23 can define a chamber 30 that surrounds the top face 13. The top portions 29 of the vanes 23 can be a substantially planar surface for mounting the heat spreader 15 so that heat transferred to the heat spreader 15 via the heat pipes 14 is thermally transferred to the vanes 23. Alternatively, the top portions 29 can be a profiled surface that complements a profile of the bottom surface 15b of the heat spreader 15. The chamber 30 is preferable because it provides a space for an air flow F to circulate over the top face 13 to dissipate heat from the split-core 11 and for the air flow F to pass over the vanes 23 and through the slots S. The chamber 30 also allows for increased air circulation through the vanes 23 proximate the top portions 29 so that heat transferred to the vanes 23 from the heat spreader 15 is efficiently dissipated by the air flow F. The top face 13 of the split-core 11 may be substantially flush with the roots 27 of the twin fins 21 (see FIG. 2a), may extend outward the roots 23 (see FIG. 2b), or may be positioned below an upper most portion of the roots 27 (see FIG. 14).

In FIG. 2c, waste heat $H_W$ from a component (not shown) is thermally conducted into the split-core 11 through the mounting surface 19. The waste heat $H_W$ is dissipated by the air flow F that passes over the vanes 23, the top face 13, the split-core 11, and through the slots S. The air flow F can be from an air flow source such as a fan, for example. Although the heat spreader 15 is not depicted in FIGS. 2c and 3, the top portions 29 of the vanes 23 are in thermal communication with the heat spreader 15 and heat transferred from the heat spreader 15 to the top portions 29 of the vanes 23 is also dissipated by the air flow F. Preferably, the top portion 29 is sized to maximize its contact area with the heat spreader 15 (i.e. the bottom surface 15b) so that heat transfer from the heat spreader 15 to the vanes 23 is maximized. For example, in FIG. 1a, if the bottom surface 15b has a width of W1 and the top portion 29 has a length of L1 (see FIGS. 9b and 10a), then for this example L1 is preferably substantially equal to W1 (L1≈W1).

Figure 4:
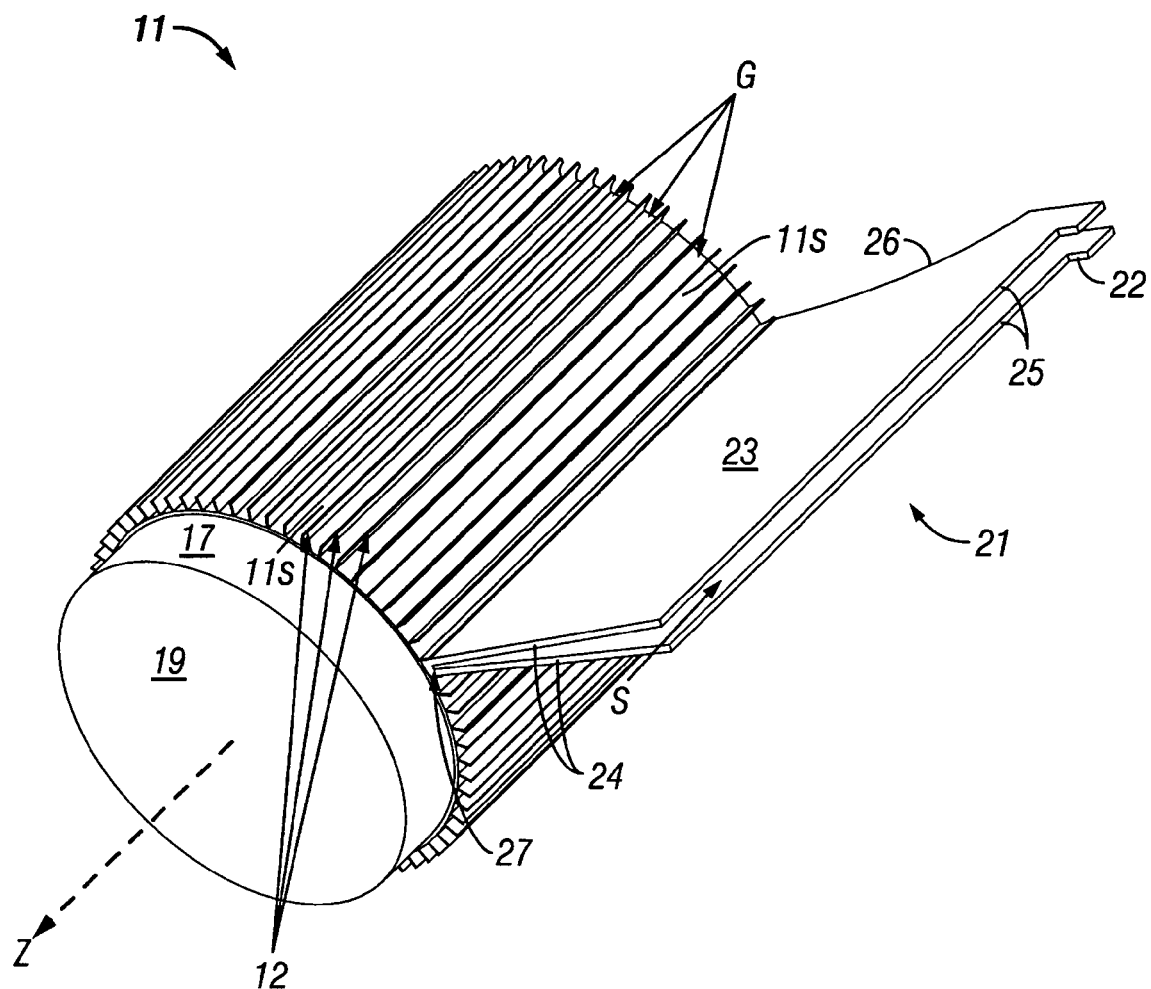
FIG. 4 is a profile view depicting a twin fin connected with a split-core.

Turning to FIG. 4, a plurality of grooves G are adapted to receive the root 27 of the twin fins 21. The grooves G can be formed by a pair of spaced apart projections 12 that extend outward of a surface 11s of the split-core 11. A space between adjacent projections 12 is sufficient to receive a width 27w of the root of the twin fin 21. Alternatively, in FIGS. 5a and 5b, the groove G can extend inward of the surface 11s and the groove G can include a width and a depth sufficient to receive the root 27 of the twin fins 21. As will be described below, the grooves G can be aligned with an axis Z of the split-core 11 or the grooves G can be aligned at an angle with the axis Z (see β in FIG. 7a). Factors including a size of the split-core 11 (e.g. its circumference if the split-core 11 is cylindrical) and the width 27w of the roots will determine a maximum number of the twin fins 21 that can be connected with the split-core 11.

Referring to FIGS. 5a and 5b, the root 27 can be inserted into the groove G by using a tool 90. The tool 90 can complement a shape of the slot S and the tool 90 can be used to urge the root 27 into the groove G so that the root 27 is firmly connected with the groove G and the root 27 is in contact with the groove G substantially over its entire length along the split-core 11. As an example, the twin fin 21 can be fixedly connected with the groove G by applying a solder or the like to the root 27 and/or the groove G prior to insertion, then the root 27 can be soldered in the groove G. The tool 90 can be used to hold the root 27 in the groove G to prevent the twin fin 21 from moving during the insertion process.

Similarly, a brazing process can be used to connect the root 27 with the groove G. To enhance thermally conductivity between the split-core 11 and the twin fin 21, a thermal sealant or a thermal interface material can be positioned in the groove G and/or on the root 27 prior to insertion. Although not depicted in FIGS. 5a and 5b, the above processes can be used when the groove G is formed by the projections 12 depicted in FIG. 4. Other methods can be used to connect the root 27 with the groove G and the present invention is not to be construed as being limited to the methods disclosed herein. For instance, welding, vacuum brazing, adhesives, and glue are examples of other methods that can be used to effectuate a connection of the roots 27 with the grooves G.

Figure 6A:
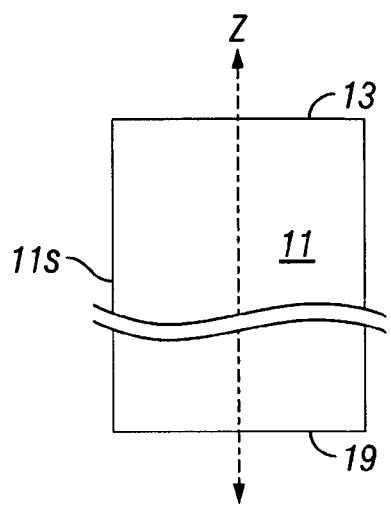
FIGS. 6a through 6g are cross-sectional views depicting examples of profiles of a top face of a split-core.
Figure 6B:
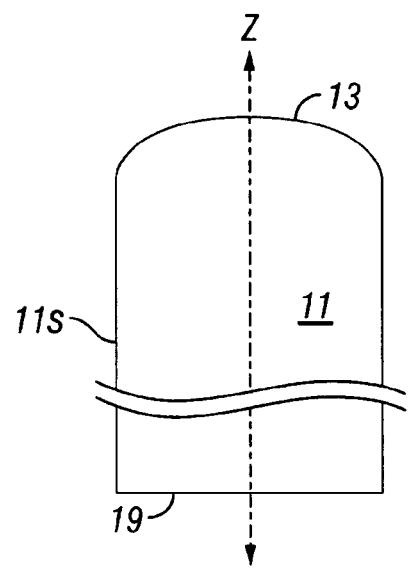
Figure 6C:
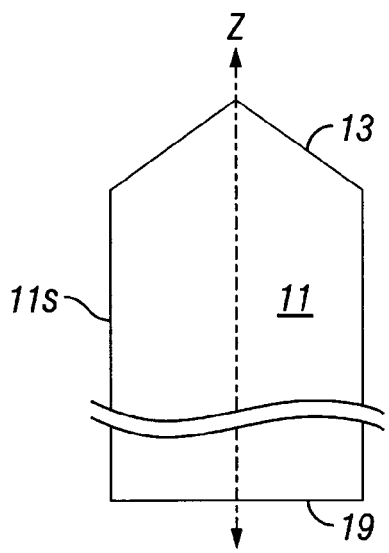
Figure 6D:
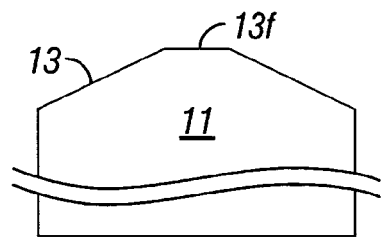
Figure 6E:
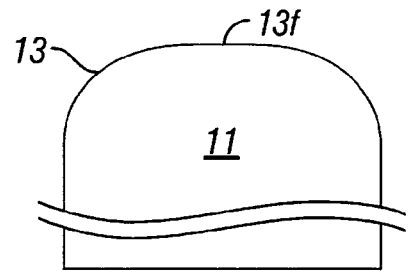
Figure 6G:
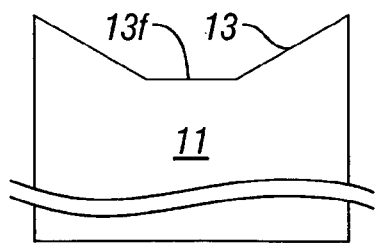
Figure 6F:
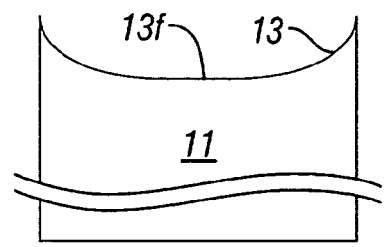

In FIGS. 6a through 6g, examples of various configurations for the top face 13 of the split-core 11 are depicted. The top face 13 can include a planar profile in FIG. 6a (see 13 in FIG. 2a), an arcuate profile in FIG. 6b, and a sloped profile in FIG. 6c. In FIGS. 6d and 6e, the sloped and arcuate profiles can terminate in a frustum 13f (see 13f in FIG. 2b). In FIGS. 6f and 6g, the top face 13 includes concave arcuate and concave sloped profiles respectively, and those profiles can include the frustum 13f. The profile of the top face 13 can be selected based on air flow management in the chamber 30 and/or to increase the air flow F over the top face 13 to enhance heat transfer from the split-core 11 to the air flow F.

Turning to FIGS. 7a and 7b, the grooves G can include a length L that substantially spans an entirety of a length of the surface 11s of the split-core 11. The root 27 of each twin fin 21 can have a length that is substantially equal to the length L of the grooves G. In FIG. 7a, the grooves G come short of extending all the way down to the mounting surface 19 by a distance d1 so that the base 17 can be inserted into a mounting means as will be describe below. The distance d1 can be 5.0 mm or less, for example. Accordingly, the length L spans a substantial entirety of the surface 11s. As was described above, the distance d between the bottom of the heat pipe 14 and the mounting surface 19 should be sufficient to prevent a mechanical interference with the mounting of the cooling device 10 to the mounting means. The grooves G can be aligned with the axis Z of the split-core 11 or the grooves G can have an angular orientation β with the axis Z. In FIG. 7b, the base 17 can be inset from the surface 11s of the split-core 11 as depicted by a distance d2. The distance d2 narrows a width of the base 17 and the distance d2 can match a width of an aperture in the mounting means (see 102 in FIG. 11c).

In FIGS. 8a through 8e, each twin fin 21 includes a root 27 that is common to both vanes 23, an outer edge 25, a trailing edge 24, a leading edge 26, and a top portion 29. Optionally, the outer edge 25 of the vane 23 can include a lip 22 that extends outward of the outer edge 25. The lip 22 provides a surface against which a mounting ring (see 80 in FIG. 17) can be mounted for connecting an air flow source with the cooling device 10. The leading edge 26 of the vane 23 can include a profile that is straight (i.e. planar), arcuate, sloped, or a composite profile that is combination of one or more of the aforementioned profiles (see FIGS. 8a and 8b). The profile can be selected to control the air flow F in the chamber 30, over the top face 13, over the vanes 23, and through the slots S. The profile may also be selected to complement a shape of a fan blade that is positioned proximate the chamber 30 to provide the air flow F. Although the trailing edge 24 is depicted as being substantially planar, the trailing edge 24 may also be profiled and can include a straight, an arcuate, a sloped, or a composite profile that is combination of one or more of the aforementioned profiles. The slots S between the vanes 23 can diverge from the root 27 to the outer edge 25 so that the slot S widens in a direction from the root 27 to the outer edge 25.

To facilitate connecting the heat pipes 14 with the split-core 11 and the heat spreader 15, a cut-out 23c can be formed in some of the vanes 23 to allow a portion of the heat pipes 14 to pass through the vanes 23 as depicted in FIG. 1b. The cut-out 23c prevents a potential mechanical interference between the heat pipes 14 and the vanes 23 when the dimensions of the cooling device 10 will result in the heat pipes 14 passing through an area that would otherwise be occupied by a portion of the vanes 23.

The root 27 and a portion 27c (see dashed lines) of the vanes 23 may be coated with a material including but not limited to an adhesive, a glue, a solder, or a brazing compound to effectuate a connection of the twin fins 21 with the grooves G in the split-core 11. Because the portion 27c will come into contact with the projections 12 (see FIG. 4) or a wall of the groove G (see FIGS. 5a and 5b), it may be desirable to coat the portion 27c with the aforementioned materials to ensure the twin fin 21 is fixedly connected with the split-core 11. Thermal transfer of waste heat $H_W$ from the split-core 11 to the twin fins 21 can be reduced if the connection between the root 27 and the groove G is not snug and/or any portion of the root 27 is not in contact with the split-core 11. As was described above, a width 27w of the roots 27 should be selected to complement the inside dimensions of the grooves G or the projections 12 to ensure a snug fit.

Figure 9A:
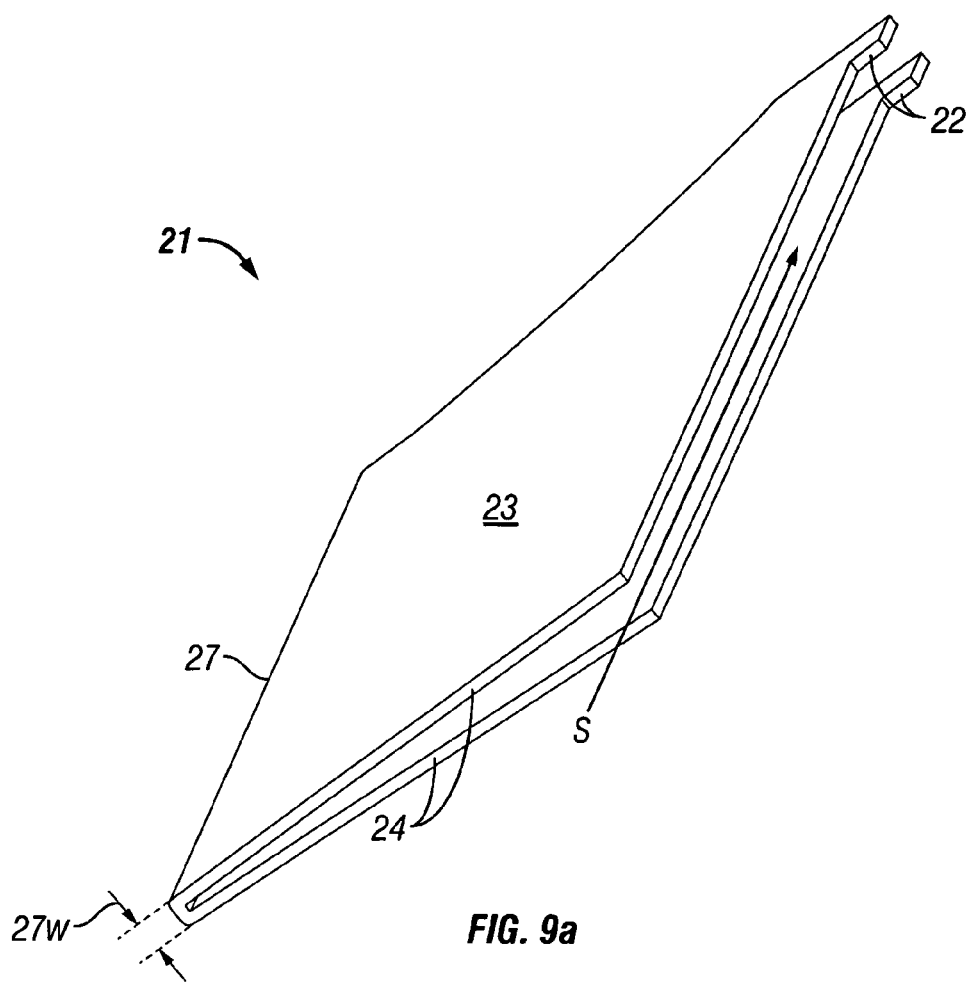
FIGS. 9a and 9b are profile views depicting vanes of a twin fin.
Figure 9B:
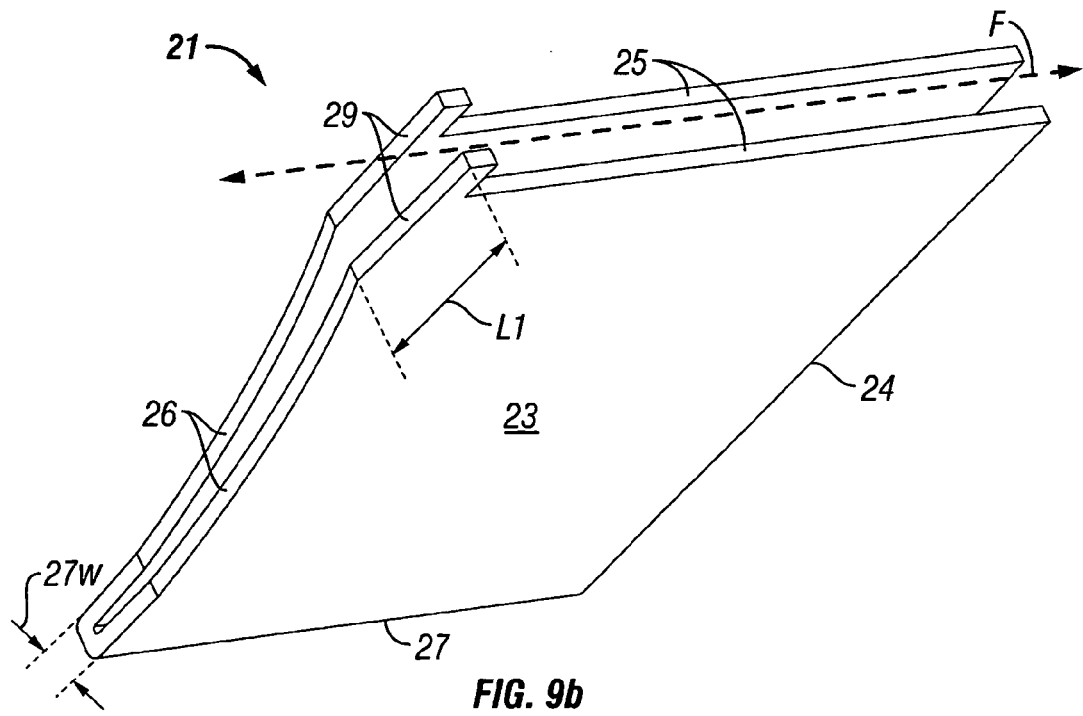
Figure 10A:
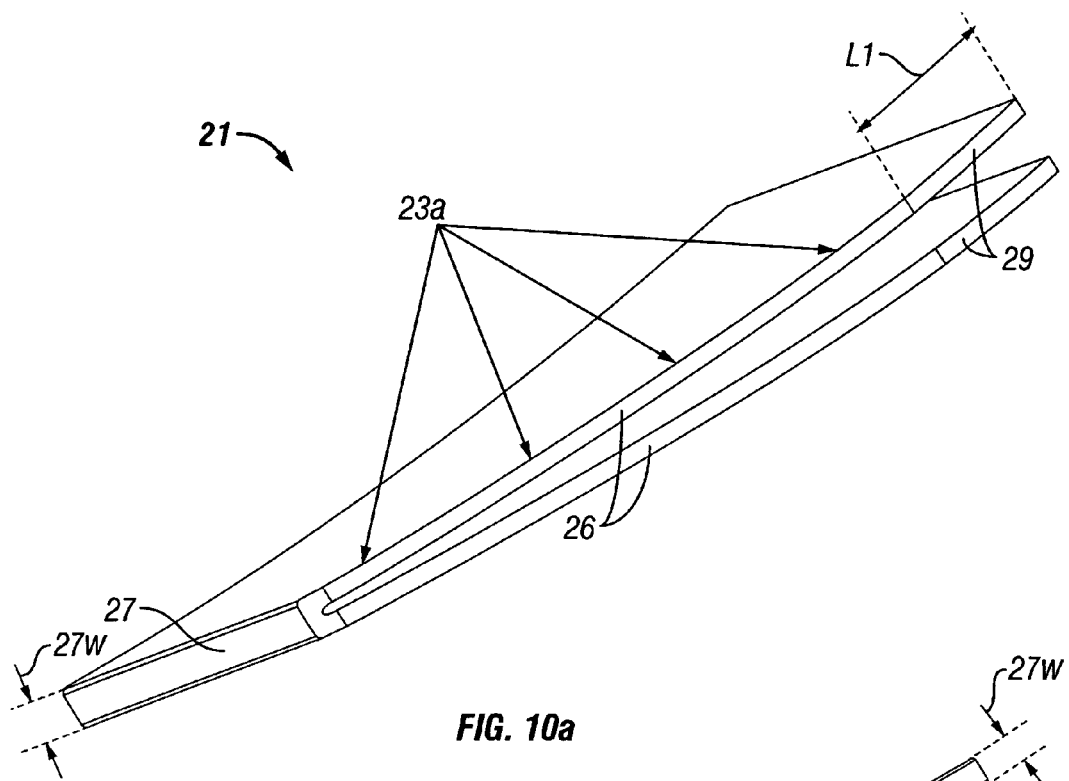
FIGS. 10a and 10b are profile views depicting an arcuate profile on vanes of a twin fin.
Figure 10B:
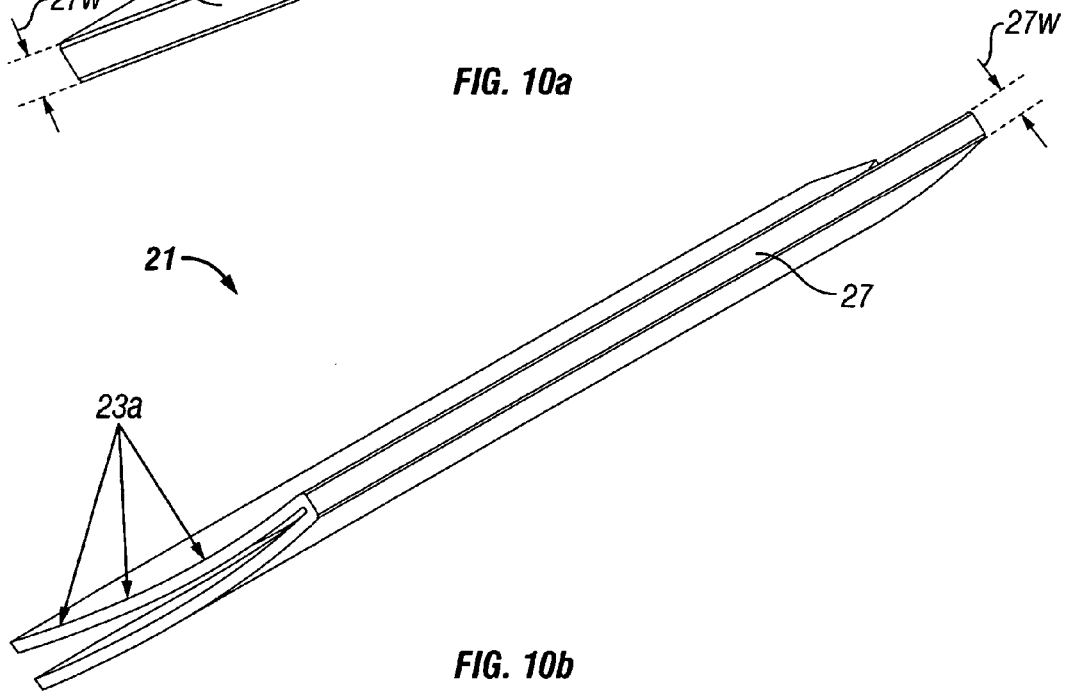

In FIGS. 9a and 9b, the vanes 23 of the twin fins 21 include a planar profile, that is, each vane 23 is a substantially flat surface from the root 27 to the outer edge 25. On the other hand, in FIGS. 10a and 10b, the vanes 23 include an arcuate profile denoted by arrows 23a. The vanes 23 can also include an angular profile (see FIG. 8e) wherein the vanes 23 have one or more portions that are at an angle α with respect to another portion of the vane 23 or with respect to some predetermined reference point on the twin fin 21 or on the split-core 11. The arcuate profile 23a depicted in FIGS. 10a and 10b can be selected to be tangential to a point on the split-core 11, such as a circle of a predetermined diameter and centered about the axis Z of the split-core 11. As an example, the arcuate profile 23a can be selected to match a curvature of a fan blade (not shown) on a fan that is mounted over the chamber 30. Matching a curvature of the vanes 23 with a curvature of the fan blade can result in lower air shock noise caused by the air flow F moving over the vanes 23 and through the slot S.

Figure 10C:
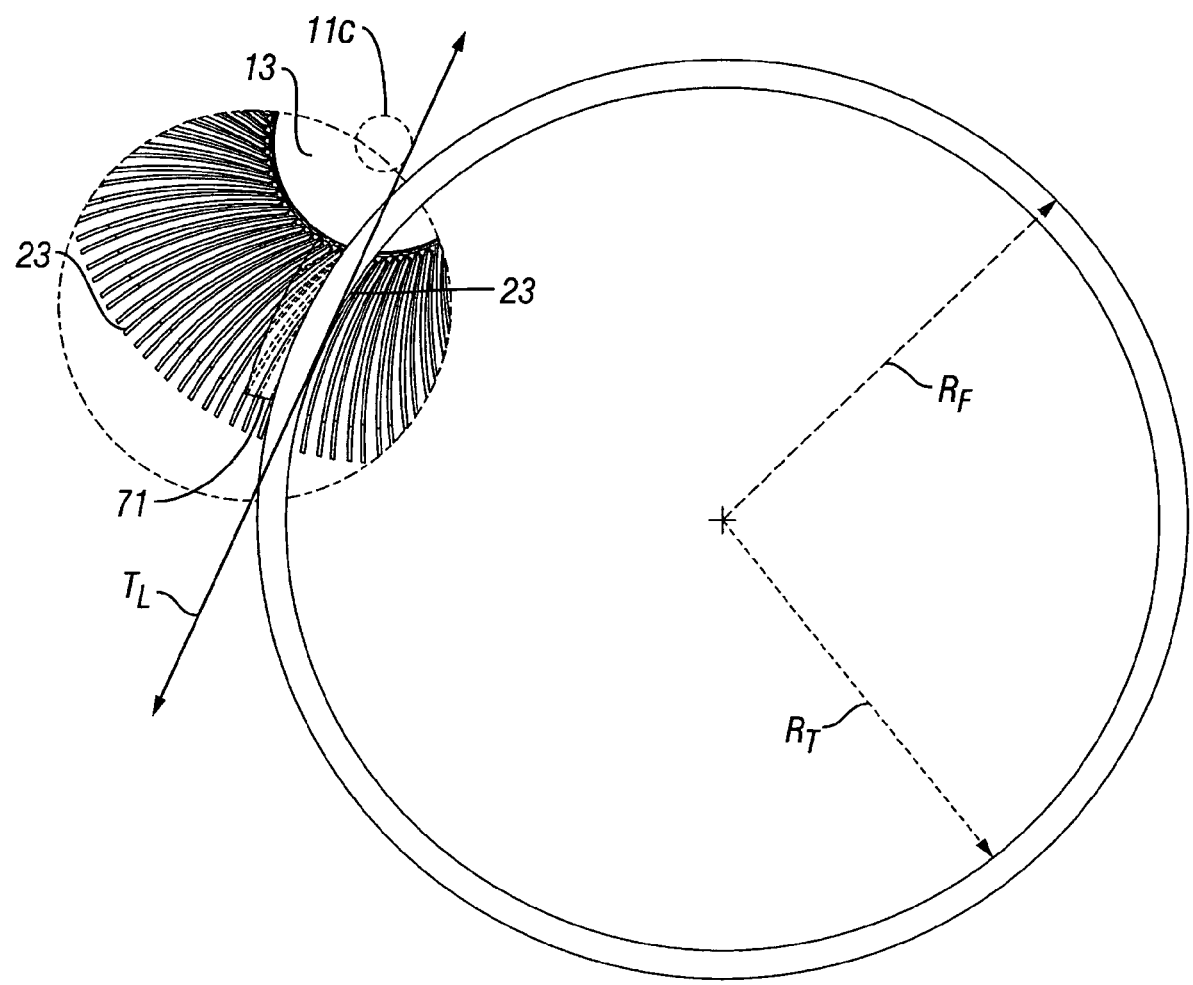
FIG. 10c depicts a tangential relationship between a curvature of a vane and a fan blade.

Turning to FIG. 10c, a circle 11c centered about the axis Z of the split-core 11 has a tangent line $T_L$ that is tangent to the circle 11c and is tangent to a curvature of the arcuate profile 23a of vanes 23 as denoted by a second circle having a radius $R_T$ that is equal to a distance from the root 27 to the outer edge 25 of the vanes 23. A second circle having a radius $R_F$ represents a radius of a fan blade 71 (shown superimposed over the vanes 23) from a center of a hub of a fan (not shown). The curvature of the fan blade 71 matches the arcuate profile 23a of the vanes 23 such that the two circles defined by radius lines ($R_T$ and $R_F$) are concentric with each other.

Figure 11A:
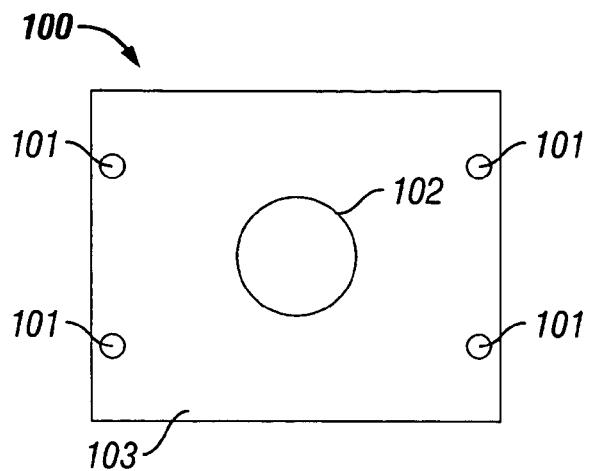
FIGS. 11a through 11c are top, cross-sectional, and bottom views of a base plate.
Figure 11B:
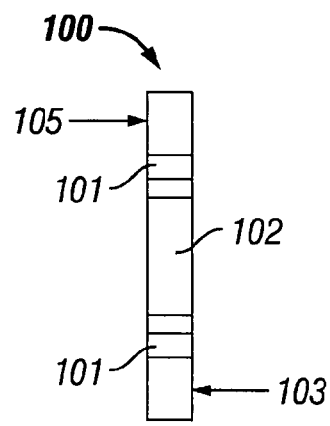
Figure 11C:
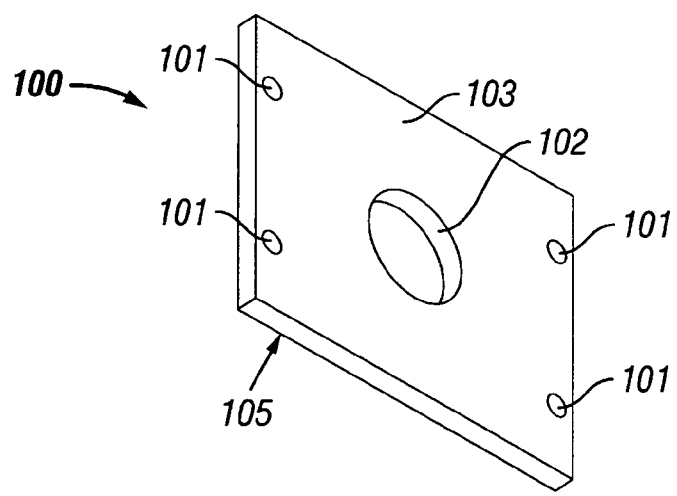

In FIGS. 11a through 11c, a base plate 100 includes a top surface 103, a bottom surface 105, and an aperture 102 between the top and bottom surfaces (103, 105). The base plate 100 can include mounting holes 101 for receiving a fastener, such as a machine screw, for example. The fastener can be used to mount the base plate 100 on a PC board that carries the component to be cooled by the cooling device 10. The base plate 100 positions the mounting surface 19 of the split-core 11 in thermal contact with the component. The aperture 102 is adapted to receive the base 17 of the split-core 11. The base plate 100 can have any shape and is not limited to the rectangular shape depicted herein. The base plate 100 can have any shape that can accommodate a bore through which the cooling device 10 can be connected with the base plate 100.

Figure 12A:
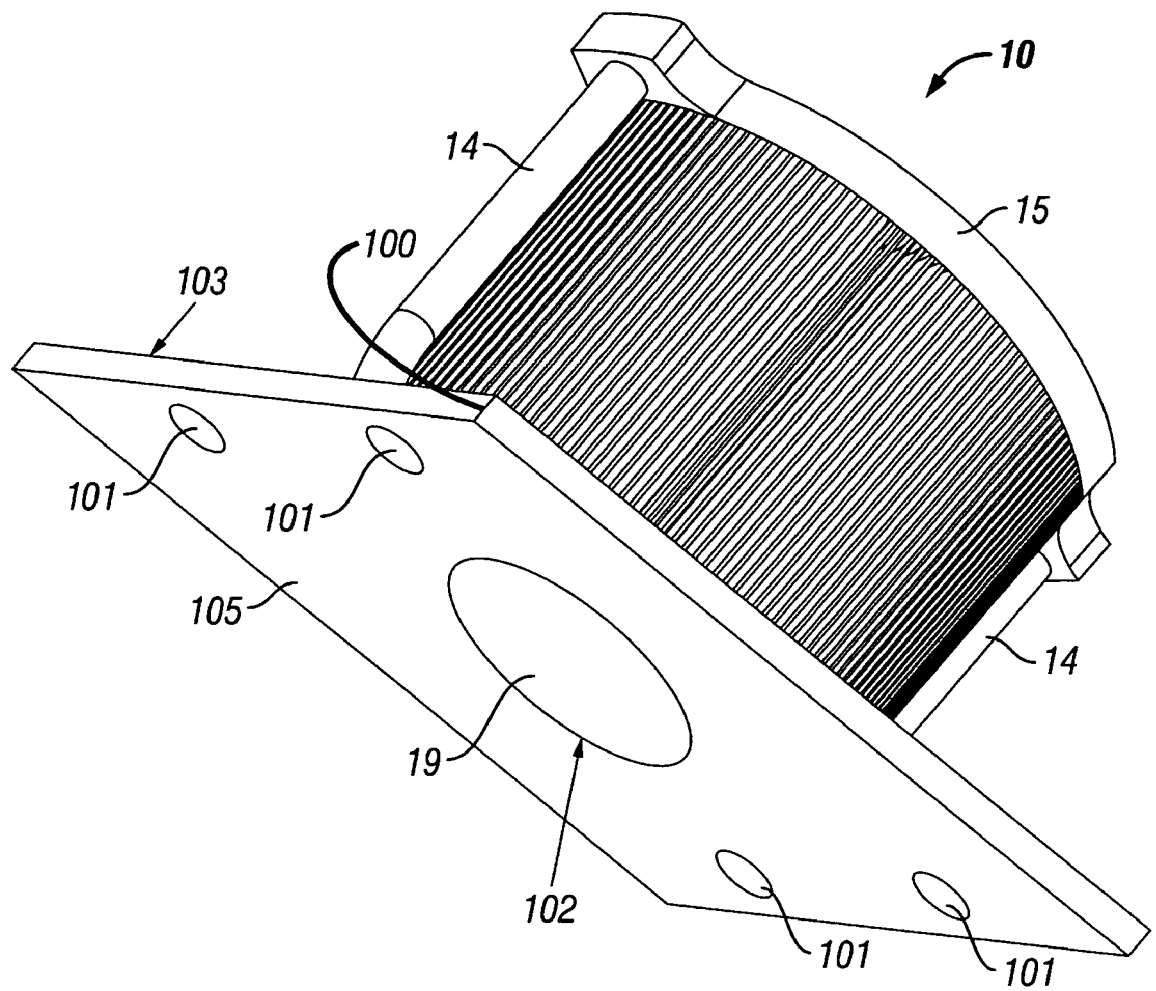
FIGS. 12a and 12b are bottom and top profile views depicting a cooling device connected with a base plate.
Figure 12B:
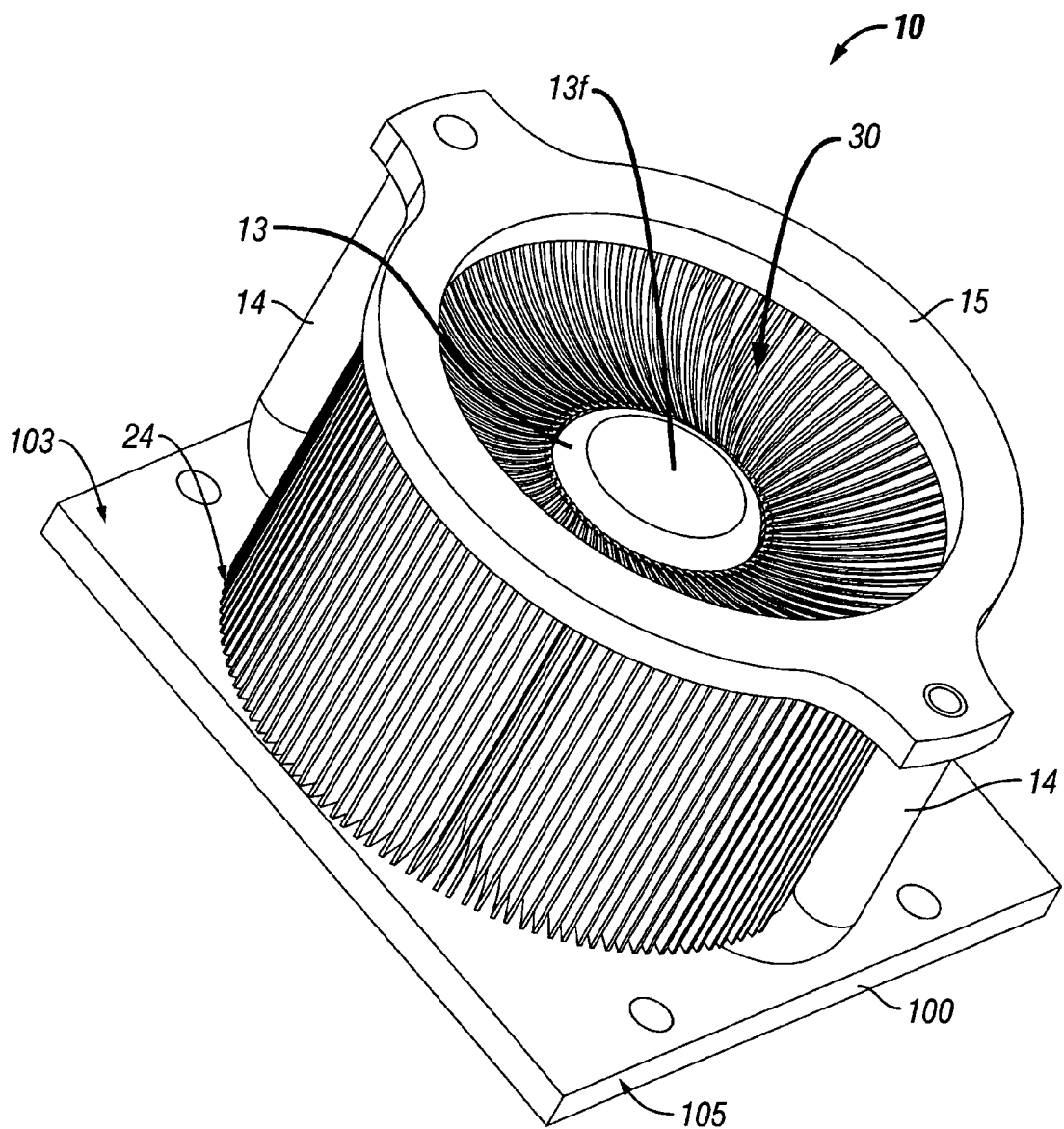

In FIG. 12a, the base 17 can be inserted into the aperture 102 and then retained in the aperture 102 by a variety of methods including but not limited to welding, friction stir welding, soldering, brazing, gluing, or by a friction fit between the base 17 and the aperture 102. The mounting surface 19 may or may not be flush with the bottom surface 105. In FIG. 12b, after mounting the cooling device 10 to the base plate 100 the distance d (see FIG. 1d) should be such that the bottom of the heat pipes 14 are positioned above the top surface 103 of the base plate 100 or the bottom of the heat pipes 14 are in contact with the top surface 103. Preferably, the bottom of the heat pipes 14 are positioned above the top surface 103 to prevent damage to the heat pipes 14 and/or to prevent unwanted heat transfer from the heat pipes 14 to the base plate 100.

Figure 13A:
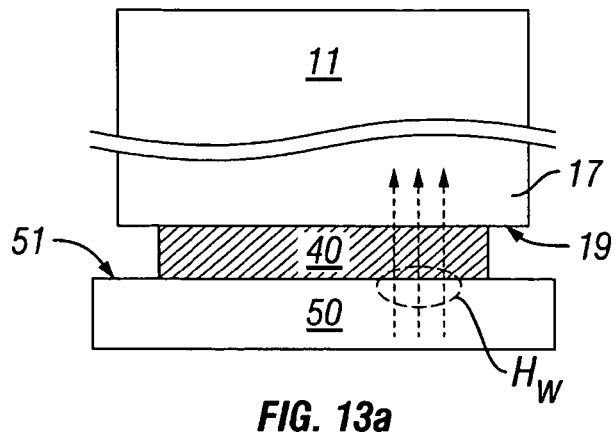
FIGS. 13a and 13b are cross-sectional views depicting a thermal interface material in contact with a split-core and a component.

In FIG. 13a, a thermal interface material 40 can be positioned on the mounting surface 19. The thermal interface material 40 reduces thermal resistance between a surface 51 of a component 50 and the mounting surface 19. The thermal interface material 40 can also serve to seal micro voids on the surface 51 thereby increasing waste heat $H_W$ transfer from the component 50 to the split-core 11.

Figure 13B:
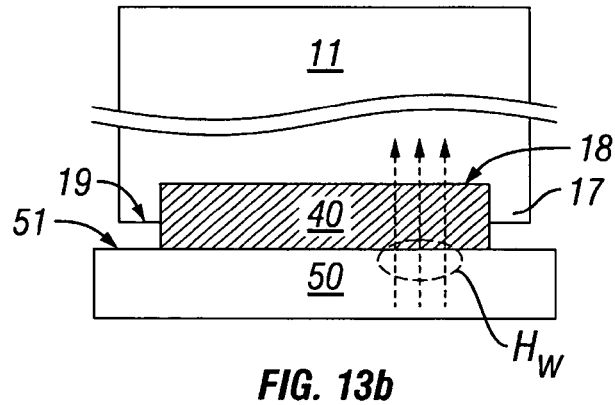

Alternatively, in FIG. 13b, the mounting surface 19 can include a cavity 18 inset from the mounting surface 19. A thermal interface material 40 can be positioned in the cavity 18. The thermal interface material 40 can be flush with the mounting surface 19, can be inset from the mounting surface 19, or can extend outward of the mounting surface 19.

Figure 13C:
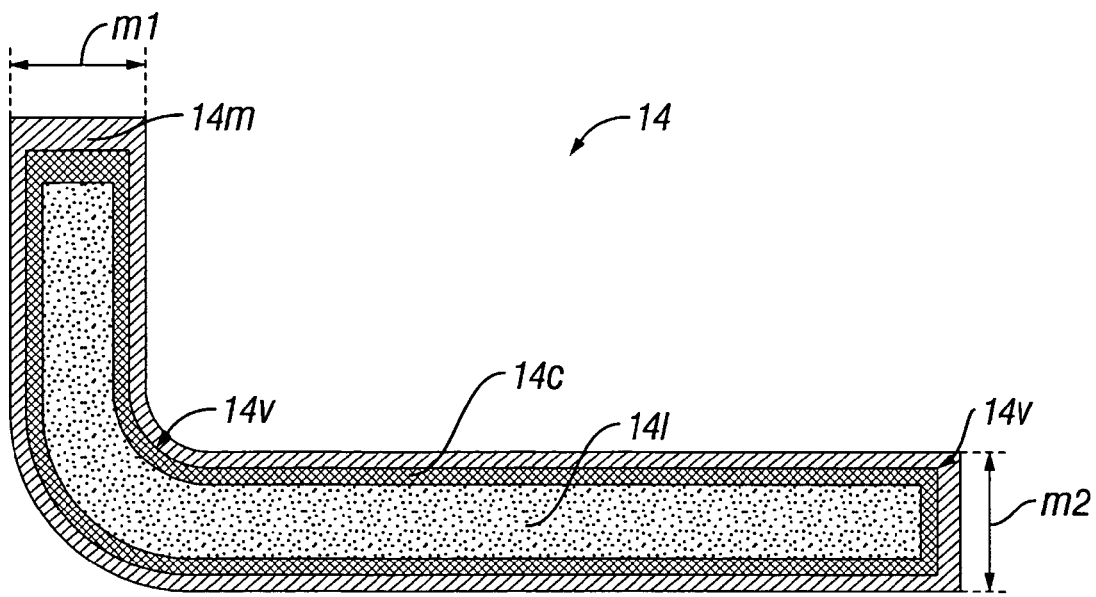
FIG. 13c is a cross-sectional view depicting an example of a heat pipe.

Referring to FIG. 13c, the heat pipe 14 can be implemented using a variety of heat pipe technologies that are well understood in the electronic arts. For example, the heat pipe 14 can be made from a solid piece of a high thermal conductivity material 14m such as copper (Cu), aluminum (Al), and stainless steel, for example. On the other hand, the heat pipe 14 can comprise the high thermal conductivity material 14m with a sealed interior volume 14v that contains a capillary structure 14c and a working fluid 14f. The capillary structure circulates the working fluid 14f as the fluid 14f transitions from a vapor state back to a condensed liquid state. Typically, the working fluid 14f is sealed at a low pressure and is characterized by having a high thermal conductivity, a high surface tension, and a high latent heat of vaporization. For example, a fluid including but are not limited to water, sodium, methanol, and acetone can be used for the working fluid 14v. The capillary structure 14c can include but is not limited to a plurality of grooves, a mesh, a fiber, and sintered powder. Dimensions m1 and m2 of the heat pipe 14 should be selected to complement the apertures 17a and 15a of the split-core 11 and the heat spreader 15, respectively. For example, the dimensions m1 and m2 can be 8.0 mm in diameter and the apertures 17a and 15a can be sized to accommodate those dimensions. The heat pipe 14 can be an off-the-shelf commercially available model or a custom made model by a company such as Thermacore® or Yeh-Chiang Technology Corporation® (YC Tek), for example.

Figure 14:
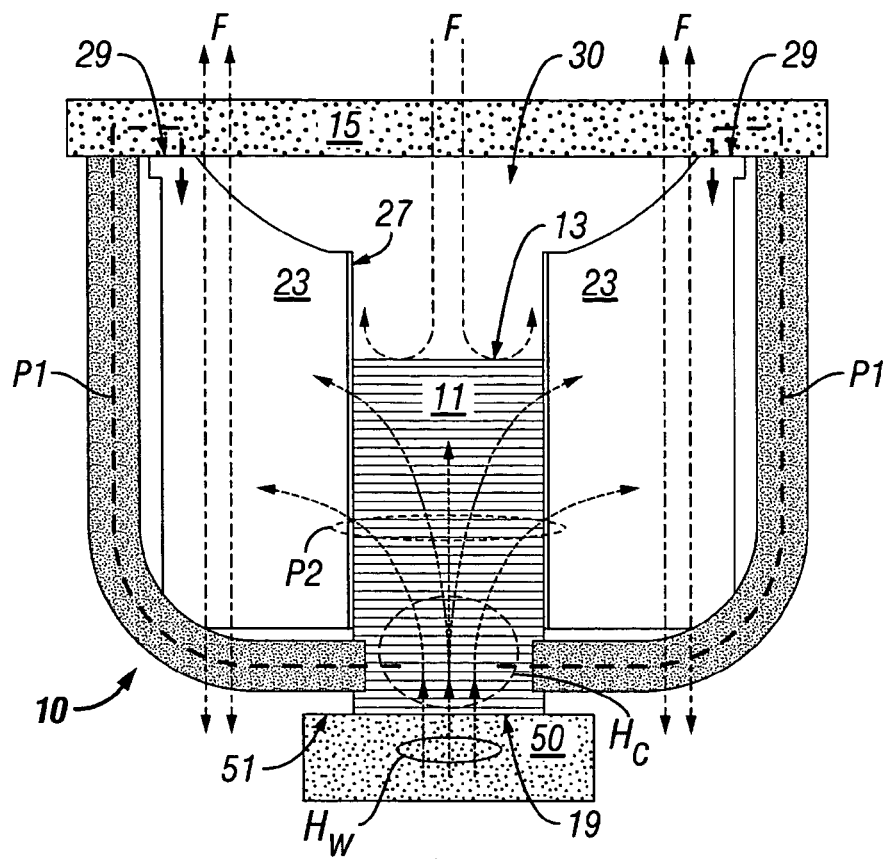
FIG. 14 is a cross-sectional view depicting multiple paths for a heat flow in a cooling device with a split-core.

In FIG. 14, a component 50 is in thermal communication with the mounting surface 19 of the split-core 11. The thermal communication can be by a direct contact between the component 50 and the mounting surface 19 as depicted or via an intermediate structure such as the thermal interface material 40, for example. Waste heat $H_W$ enters the split-core 11 via the mounting surface 19 and is concentrated near the base 17 where the heat pipes 14 are connected with the split-core 11. Even though the waste heat $H_W$ is thermally conducted throughout a volume of the split-core 11, a heavy dashed oval depicts a region in the split-core 11 where a heat flux concentration $H_C$ is highest. The heat flux concentration $H_C$ can be particularly problematic when the component 50 is a high power dissipation, state-of-the-art, microprocessor such as the type used in leading edge workstations, desk top PC's, servers, and laptop computers. The heat flux concentration $H_C$ is highest at a surface 51 of the component 50 and in the region depicted by the heavy dashed oval. To efficiently cool the component 50 it is desirable to reduce the heat flux concentration $H_C$ in the split-core 11. The split-core 11, the heat pipes 14, and the heat spreader 15 effectively reduce the heat flux concentration $H_C$ by providing multiple thermal paths to dissipate the waste heat $H_W$.

In a first path P1, a first portion of the heat flux concentration $H_C$ is thermally transferred by the heat pipe 14 to the heat spreader 15 where the heat is then transferred to the to the vanes 23 via the top portion 29 where the air flow F over the vanes 23 dissipates the heat. In a second path P2, the split-core 11 thermally conducts a second portion of the heat flux concentration $H_C$ upward towards the top face 13 where the heat spreads outward to the roots 27 of the twin fins 21 and is dissipated by the air flow F over the vanes 23, the top face 13, the split-core 11, and through the slots S.

Another advantage of the multiple paths (P1, P2) is that a length of the split-core 11 need not span the entire length of the roots 27 of the twin fins 21. Instead, the top face 13 of the split-core 11 can be recessed below an uppermost portion of the roots 27 as depicted in FIG. 14. As a result, the cooling device 10 can be made smaller with a lower mass and a lower cost.

Referring to Table 1 where data in a right column depicts an increase in heat removal efficiency of the cooling device 10 of the present invention in comparison to a prior cooling device with a split-core 11 but without the heat pipes 14 or the heat spreader 15. Both cooling devices had sixty twin fins 21 connected with their respective split-cores 11, a height of 50 mm (excluding the fan), and a diameter of 69 mm measured at the outer edges 25 of the twin fins 21. The prior cooling device without the heat spreader 15 or the heat pipes 14 had a mass of 900 grams. In contrast, the cooling device 10 had a mass of 500 grams. The mass of both cooling devices did not include the mass of the Delta cooling fans. The cooling device 10 included two heat pipes 14 and the heat pipes 14 with a diameter of 8.0 mm and made by YC Tek.

In Table 1, the case temperature is a temperature measured at the component 50 (e.g. at the surface 51) after the component 50 has reached a stable temperature so that a temperature difference ΔT between the case temperature and the ambient temperature can be measured. A thermal resistance of the cooling devices is calculated by dividing the ΔT by a thermal output of the component 50 in Watts (e.g. ΔT÷W). Therefore, for the cooling device 10 the thermal resistance was ([41°C.−25° C.]÷100 W=0.16° C./W). With 100 W of power dissipation from the components 50, the cooling device 10 had a 6° C. lower case temperature and a 0.06° C./W lower thermal resistance for an improvement of 27% compared with the cooling device without the heat pipes 14 and heat spreader 15 (e.g. [{(0.22−0.16)÷0.22}*100]=27.2727% ). Another advantage of the cooling device 10 is that its mass is lower by 400 grams (i.e. 900 grams-500 grams) when compared to the cooling device without the heat pipes 14 and heat spreader 15.

TABLE 1

| Data | A Prior Cooling Device without Heat Pipes 14 or Heat Spreader 15 | Cooling Device 10 with Heat Pipes 14 and Heat Spreader 15 |
| --- | --- | --- |
| Mass of Cooling Device | 900 grams | 500 grams |
| Thermal Output of Component | 100 W | 100 W |
| Fan Type | Delta EFB0712EH | Delta EFB0712EH |
| Case Temperature | 47° C. | 41° C. |
| Ambient Temperature | 25° C. | 25° C. |
| Thermal Resistance | 0.22° C./W | 0.16° C./W |
| Improvement | 0% | 27% |

Referring to FIG. 14, the air flow F can be in a direction from the leading edge 26 to the trailing edge 24 or from the trailing edge 24 to the leading edge 26. Accordingly, an air flow source, such as a fan, can either push or pull air through the slots S and over the vanes 23. The air flow F entering the chamber 30 can also circulate over the top face 13 to dissipate the waste heat $H_W$ from the split-core 11. The split-core 11 can have a length L that is long relative to a width W of the split-core 11 (see FIG. 7b) so that an aspect ratio (L÷W) of the split-core 11 is large and the waste heat $H_W$ is thermally conducted up the split-core 11 along the second path P2 towards the top face 13. As described above, the roots 27 and grooves G can span substantially all of the length L so that the waste heat $H_W$ is transferred from the split-core 11 to the twin fins 21 along the entire length of the roots 27. The split-core 11 can be made from a high thermal conductivity material (e.g. copper or graphite) that efficiently conducts the waste heat $H_W$ upward along the axis Z and outward towards the twin fins 21 so that the waste heat $H_W$ is spread over a larger area. As a result, the heat flux concentration $H_C$ at the surface 51 of the component 50 and in the base 17 is reduced.

Figure 15:
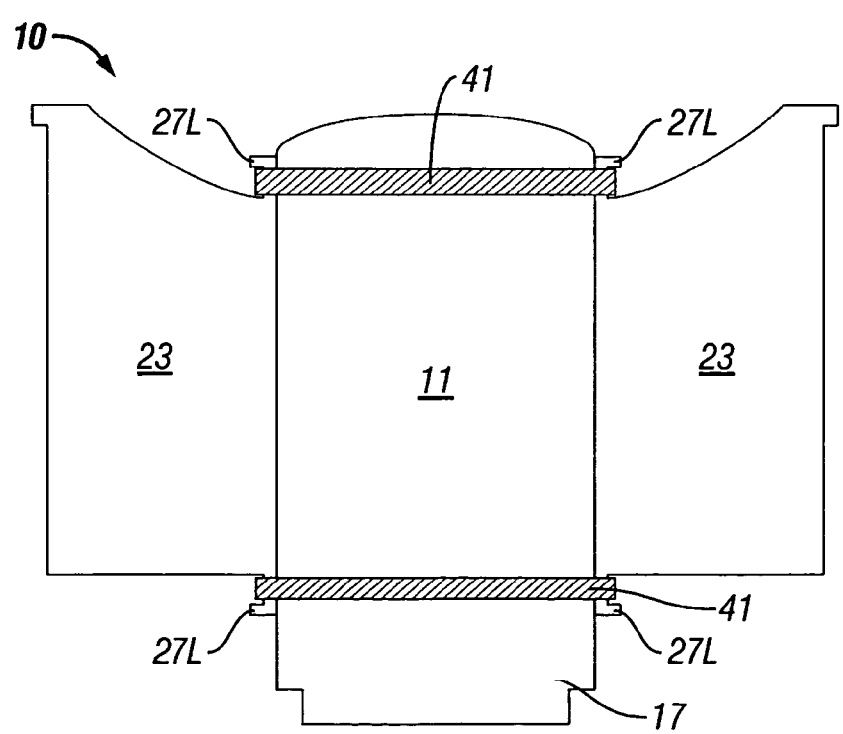
FIG. 15 is a cross-sectional view depicting a clamp for connecting a plurality of twin fins to a split-core.

In FIG. 15, the roots 27 of the twin fins 21 can be connected with the grooves G using a clamp 41 that clamps around an ear 27L on the root 27. The clamp 41 can be a C-clamp, a clamping ring, or the like and can exert a force on the roots 27 that urges the roots 27 into firm contact with the grooves G. As described above, a thermal interface material or a thermal sealant material can be applied to the roots 27 and/or the grooves G to reduce thermal resistance between the split-core 11 and the twin fins 21.

Figure 16:
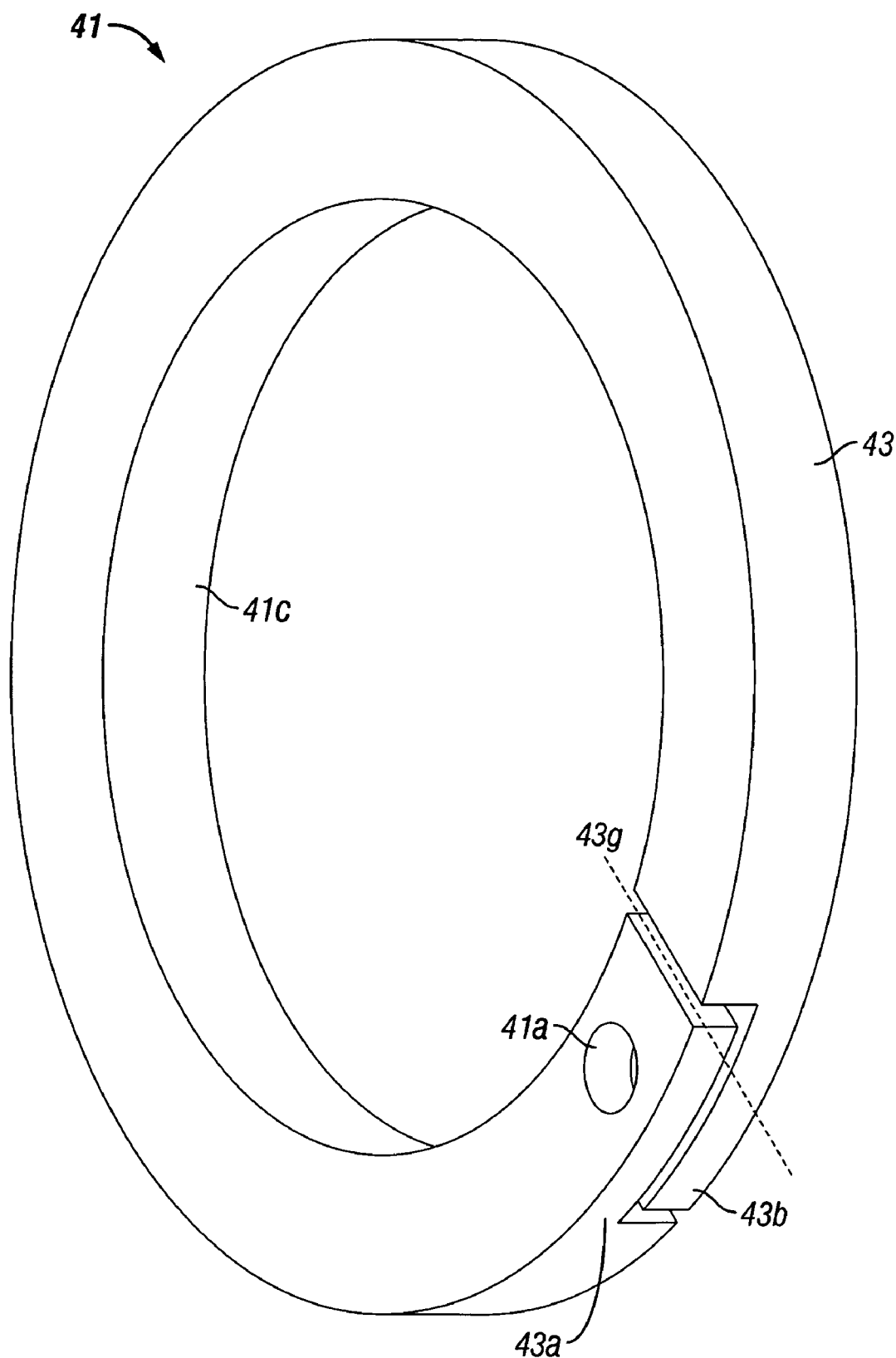
FIG. 16 is a profile view depicting a clamp.

One example of an implementation of the clamp 41 is depicted in FIG. 16, where the clamp 41 includes a clamp body 43 with a gap 43g (see dashed line) in the clamp body 43. At the gap 43g, the clamp body 43 is split into two parts 43a and 43b with an aperture 41a formed in both parts (43a, 43b). The aperture 41a can receive a fastener or the like to urge the two parts (43a, 43b) together so that a clamping force is exerted on the roots 27 of the twin fins 21 by a clamping surface 41c. The clamping force urges the roots 27 into contact with the grooves G. As described above, in order to ensure a low thermal resistance connection between the roots 27 and the grooves G along the entire length of the grooves G, a thermal sealant or thermal interface material can be applied to the roots 27 and/or the grooves G.

Figure 17:
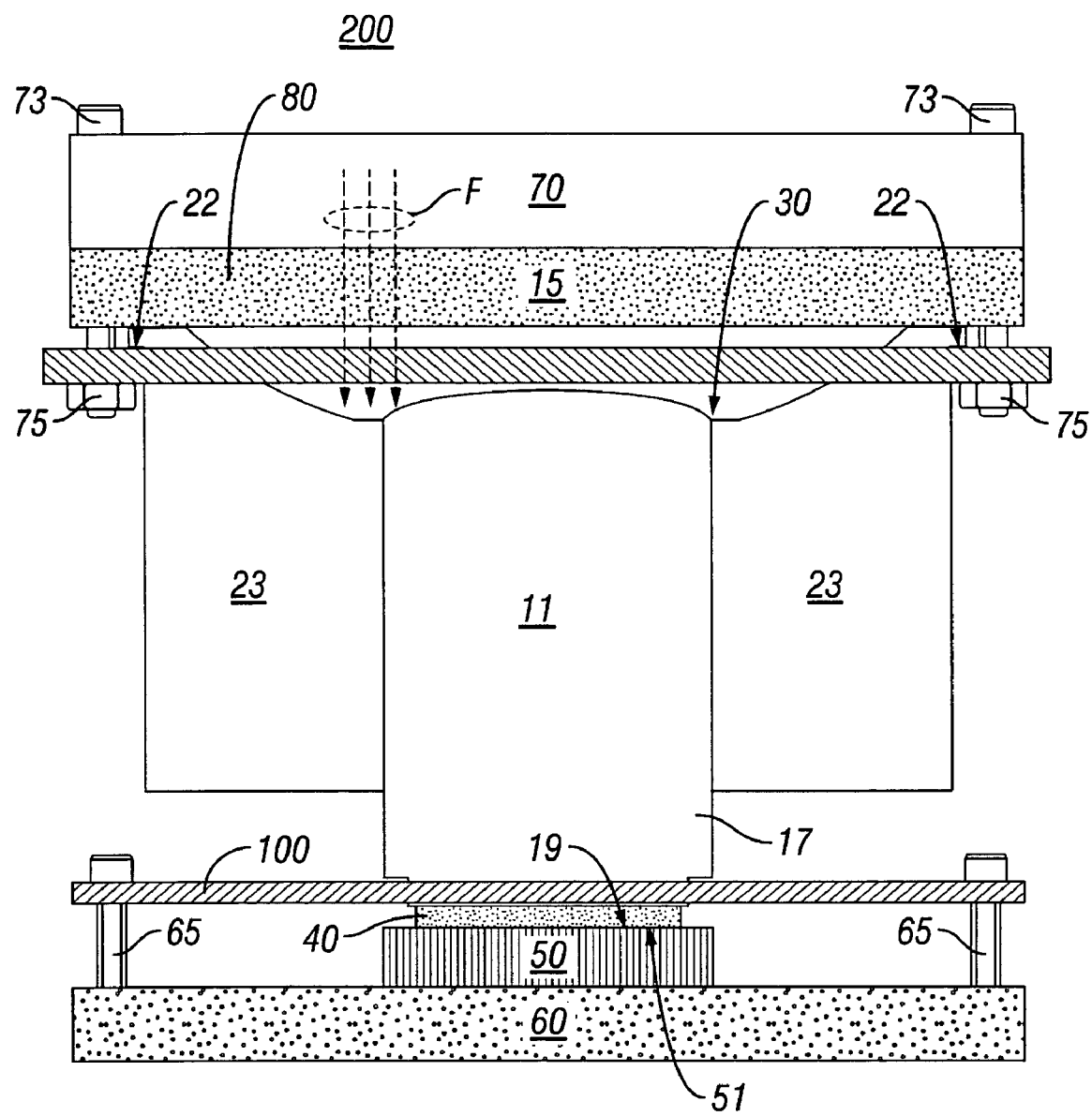
FIG. 17 is a cross-sectional view depicting an air flow source mounted to a cooling device using a mounting ring.

In FIG. 17, as one example of an air flow source 70, a fan can be mounted on the cooling device 10. The mounting can be accomplished using a mounting ring 80 that abuts with the lips 22 on the outer edges 25 of the vanes 23. Holes (not shown) formed in the air flow source 70 and the heat spreader 15 can accommodate fasteners 73 and 75 (e.g. a nut and bolt) that pass through the holes to connect the air flow source 70 with the mounting ring 80. The blades of the air flow source 70 may be positioned inside the chamber 30 or outside the chamber 30.

Figure 18:
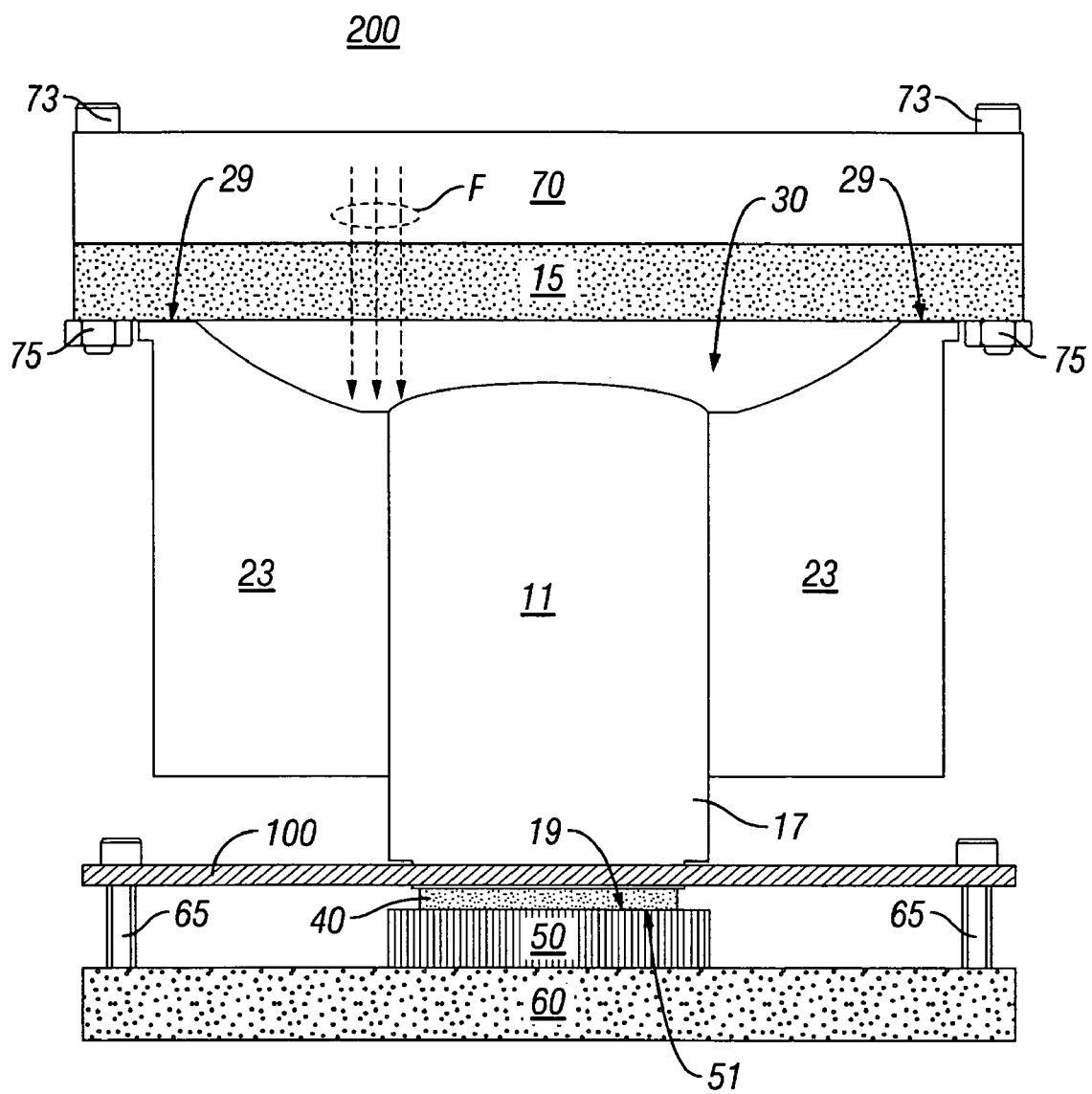
FIG. 18 is a cross-sectional view of a system for dissipating heat from a component.

Alternatively, in FIG. 18, the heat spreader 15 can include through holes that accommodate fasteners 73 and 75 (e.g. a nut and bolt) that pass through the heat spreader 15 to connect the air flow source 70 with the cooling device 10. Latch pins (not shown) can also be used to mount the air flow source 70 on the heat spreader 15. The air flow source 70 generates the air flow F and the air flow source 70 can push or pull air through the cooling device 10.

In FIGS. 17 and 18, a system 200 for dissipating waste heat $H_W$ from a component can include the cooling device 10 and the air flow source 70 as described above. The air flow source 70 can be an electric fan, for example. Additionally, the system 200 can include the base plate 100 for mounting the system 200 with the component 50 so that the mounting surface 19 is in thermal communication with the component 50 to be cooled. The thermal interface material 40 can be used to thermally communicate the waste heat $H_W$ from the component 50 to the mounting surface 19 and into the split-core 11. The base plate 100 can be mounted on a substrate 60, such as a PC board, for example, that carries the component 50. The base plate 100 can be mounted with the substrate 60 using fasteners 65 inserted through the mounting holes 101 in the base plate 100.

The twin fins 21 can be made from a variety of thermally conductive materials including but not limited to aluminum (Al), copper (Cu), silver (Ag), gold (Au), alloys of those materials, and a high thermal conductivity resin. Preferably, the vanes 23 and the root 27 are a homogenous unit, that is, they are a unitary whole. The twin fins 21 can be manufactured using a pressing or stamping process. A bending or rolling process can be used to form the arcuate profile 23a or to form an angular or non-planar profile on the vanes 23. As an example, the twin fins 21 can be stamped from a sheet of material, such as a copper (Cu) sheet or an aluminum (Al) sheet. As another example, the twin fins 21 can be molded from a high thermal conductivity material such as a resin or a carbon fiber re-aligned resin. The vanes 23 need not be identical among the twin fins 21. Because the twin fins 21 are attached by their roots 27 to the split-core 11, twin fins 21 with vanes 23 that differ in size and shape can be connected with the split-core 11 via the grooves G.

The split-core 11 can also be made from a variety of thermally conductive materials including but not limited to aluminum (Al), copper (Cu), silver (Ag), gold (Au), alloys of those materials, silicon (Si) substrate, thermally conductive resins, and graphite. The split-core 11 can be manufacture using processes including but not limited to casting, forging, extruding, and machining. The groves G or the projections 12 can be machined in the split-core 11 or they can be formed during the casting, forging, or extruding processes. As one example, the split-core 11 can be made using a forging process or an impact forging process. A shape of the split-core 11 as well as the grooves G can be directly forged. The split-core 11 can have any shape and need not have a circular or cylindrical shape as depicted herein. The split-core 11 and the twin fins 21 can be made from dissimilar materials. As an example, the split-core 11 can be made from graphite and the twin fins 21 can be made from copper (Cu). Alternatively, the split-core 11 can be copper (Cu) and the twin fins 21 aluminum (Al).

Although several embodiments of the present invention have been disclosed and illustrated, the invention is not limited to the specific forms or arrangements of parts so described and illustrated. The invention is only limited by the claims.

What is claimed is:

1. A cooling device for dissipating heat from a component, comprising:
    a plurality of twin fins, each twin fin including a root and a pair of vanes extending outward of the root and spaced apart to define a slot between the vanes, each vane including a top portion, a leading edge, a trailing edge, and an outer edge; and
    a split-core including a plurality of grooves adapted to receive the root, a top face, a base, a mounting surface adapted to thermally connect the split-core with the component, a heat spreader connected with the top portion, and a heat pipe connected with the split-core and the heat spreader.

2. The cooling device as set forth in claim 1, wherein the heat pipe is connected with the base of the split-core.

3. The cooling device as set forth in claim 1, wherein the grooves extend inward of a surface of the split-core.

4. The cooling device as set forth in claim 1, wherein each groove comprises a pair of spaced apart projections that extend outward of a surface of the split-core.

5. The cooling device as set forth in claim 1, wherein the grooves are a selected one of aligned with an axis of the split-core or aligned at an angle with the axis of the split-core.

6. The cooling device as set forth in claim 1, wherein the vanes include a profile selected from the group consisting of a planar profile, an arcuate profile, and an angular profile.

7. The cooling device as set forth in claim 6, wherein the arcuate profile of the vanes matches a curvature of a fan blade.

8. The cooling device as set forth in claim 7 and further comprising:
    a base plate including a top surface, a bottom surface and an aperture extending between the top and bottom surfaces, the aperture is adapted to receive the base of the split-core, and the base plate is operative to position the mounting surface of the cooling device in thermal communication with the component.

9. The cooling device as set forth in claim 1 and further comprising a thermal interface material positioned on the mounting surface.

10. The cooling device as set forth in claim 1, wherein the mounting surface includes a cavity inset from the mounting surface and adapted to receive a thermal interface material.

11. The cooling device as set forth in claim 10 and further comprising a thermal interface material positioned in the cavity.

12. The cooling device as set forth in claim 1, wherein the root of each twin fin is fixedly connected with the groove.

13. The cooling device as set forth in claim 12, wherein each root is fixedly connected with the grooves using a process selected from the group consisting of welding, brazing, vacuum brazing, soldering, adhesively connecting, and gluing.

14. The cooling device as set forth in claim 1, wherein the grooves include a length that substantially spans an entirety of a length of a surface of the split-core and the root of each twin fin includes a length that is substantially equal to the length of the grooves.

15. The cooling device as set forth in claim 1, wherein the leading edge of the vanes includes a profile selected from the group consisting of a straight profile, an arcuate profile, a slope profile, and a composite profile.

16. The cooling device as set forth in claim 1, wherein the leading edges of the vanes form a chamber surrounding the top face of the split-core.

17. The cooling device as set forth in claim 1, wherein the top face of the split-core includes a profile selected from the group consisting of a planar profile, a sloped profile, and an arcuate profile.

18. The cooling device as set forth in claim 1, wherein the outer edge of each vane includes a lip extending outward of the outer edge and adapted to receive a mounting ring for connecting an air flow source with the cooling device.

19. The cooling device as set forth in claim 1, wherein the twin fins are made from a material selected from the group consisting of aluminum, copper, silver, gold, and alloys of those materials.

20. The cooling device as set forth in claim 1, wherein the split-core is made from a material selected from the group consisting of aluminum, copper, silver, gold, alloys of those materials, and graphite.

21. The cooling device as set forth in claim 1, wherein the split-core and the twin fins are made from dissimilar materials.

22. The cooling device as set forth in claim 1, wherein a shape of the vanes varies among the plurality of twin fins.

23. The cooling device as set forth in claim 1 and further comprising a thermal interface material applied to a selected one of the root, the grooves, or the root and the grooves and operative to increase heat transfer from the split-core to the twin fins.

24. The cooling device as set forth in claim 1, wherein the base is inset from a surface of the split-core.

25. A system for dissipating heat from a component, comprising:
   a cooling device including
   a plurality of twin fins, each twin fin including a root and a pair of vanes extending outward of the root and spaced apart to define a slot between the vanes, each vane including a top portion, a leading edge, a trailing edge, and an outer edge;
   a split-core including a plurality of grooves adapted to receive the root, a top face, and a base, a mounting surface adapted to thermally connect the split-core with the component, a heat spreader connected with the top portion, and a heat pipe connected with the split-core and the heat spreader; and
   an air flow source for generating an air flow over the vanes, the top face, the split-core, and through the slots to dissipate the heat from the component.

26. The system as set forth in claim 25 and further comprising:
   a base plate including a top surface, a bottom surface and an aperture extending between the top and bottom surfaces, the aperture is adapted to receive the base of the split-core, and the base plate is operative to position the mounting surface of the cooling device in thermal communication with the component.

27. The system as set forth in claim 25 and further comprising a thermal interface material connected with the mounting surface.

* * * * *